(12) United States Patent
Lynch et al.

(10) Patent No.: US 8,159,235 B2
(45) Date of Patent: Apr. 17, 2012

(54) ELECTRICAL IMPEDANCE TOMOGRAPHY OF NANOENGINEERED THIN FILMS

(75) Inventors: Jerome P. Lynch, Ann Arbor, MI (US); Tsung-Chin Huo, Ann Arbor, MI (US); Nicholas A. Kotov, Ypsilanti, MI (US); Nadine Wong Shi Kam, Ann Arbor, MI (US); Kenneth J. Loh, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 565 days.

(21) Appl. No.: 12/209,318

(22) Filed: Sep. 12, 2008

(65) Prior Publication Data

US 2009/0121727 A1  May 14, 2009

Related U.S. Application Data

(60) Provisional application No. 60/994,031, filed on Sep. 14, 2007.

(51) Int. Cl.
*G01R 27/08* (2006.01)
(52) U.S. Cl. ......................... 324/691; 324/713
(58) Field of Classification Search .................. 324/691, 324/713
See application file for complete search history.

(56) References Cited

U.S. PATENT DOCUMENTS

| | | | | |
|---|---|---|---|---|
| 6,122,599 A * | 9/2000 | Mehta | | 702/100 |
| 7,170,294 B2 * | 1/2007 | Kasevich | | 324/338 |
| 7,327,145 B2 * | 2/2008 | Haugland | | 324/338 |
| 7,491,174 B2 * | 2/2009 | Zhu et al. | | 600/533 |
| 2002/0106681 A1 * | 8/2002 | Wexler et al. | | 435/6 |

OTHER PUBLICATIONS

Dharap, Prasad et al., "Nanotube film based on single-wall carbon nanotubes for strain sensing", Institute of Physics Publishing, Nanotechnology 15 (2004) pp. 379-382.
Franklin, Nathan R. et al.; "Integration of suspended carbon nanotube arrays into electronic devices and electromechanical systems", Applied Physics Letters, vol. 81, No. 5, Jul. 29, 2002, pp. 913-915.
Hansen, Torben M. et al; "Resolution enhancement of scanning four-point-probe measurements on two-dimensional systems", Review of Scientific Instruments, vol. 74 umber 8, Aug. 2003, pp. 3701-3708.
Hasegawa, Shuji et al.; "Direct measurement of surface-state conductance by microscopic four-point probe method", Institute of Physics Publishing, J Phys.: Condens. Matter 14 (2002) pp. 8379-8392.

(Continued)

*Primary Examiner* — Jeff Natalini
(74) *Attorney, Agent, or Firm* — Harness, Dickey & Pierce, P.L.C.

(57) ABSTRACT

The present teachings relate to the application of electrical impedance tomography (EIT) to demonstrate the multifunctionality of carbon nanocomposite thin films under various types of environmental stimuli. Carbon nanotube (CNT) thin films are fabricated by a layer-by-layer (LbL) technique or other techniques and mounted with electrodes along their boundaries. The response of the thin films to various stimuli determined by relying on electric current excitation and corresponding boundary potential measurements. The spatial conductivity variations are reconstructed based on a mathematical model for the EIT technique. Here, the ability of the EIT method to provide two-dimensional mapping of the conductivity of CNT thin films is validated by (1) electrically imaging intentional structural defects in the thin films and (2) mapping the film's response to various pH environments.

19 Claims, 25 Drawing Sheets

OTHER PUBLICATIONS

Hou, Tsung-Chin, et al.; "Spatial conductivity mapping of carbon nanotube composite thin films by electrical impedance tomography for sensing applications", IOP Publishing, Nanotechnology 18 (2007) 315501 (9 pp).

Kang, Inpil et al.,; "A carbon nanotube strain sensor for structural health monitoring", Institute of Physics Publishing, Smart Mater. Struct. 15 (2006) pp. 737-748.

Loh, Kenneth J. et al.; "Multifunctional layer-by-layer carbon nanotube-polyelectrolyte thin films for strain and corrosion sensing"; IOP Publishing, Smart Mater. Struct. 16 (2007) pp. 429-438.

Loh, Kenneth J. et al.; "Tailoring piezoresistive Sensitivity of Multilayer Carbon Nanotube Composite Strain Sensors", Journal of Intelligent Material Systems and Structures 2008; 19; pp. 747-764.

Thostenson, Erik T. et al.; "Carbon Nanotube Networks: Sensing of Distributed Strain and Damage for Life Prediction and Self Healing", Advanced Materials, (2006), vol. 18, pp. 2837-2841.

Xu, M.W. et al.; "Three-dimensional carrier profiling of InP-based devices using scanning spreading resistance microscopy", Applied Physics Letters, vol. 81, No. 1, Jul. 1, 2002, pp. 177-179.

* cited by examiner

SILVER PASTE

ELECTRICAL IMPEDANCE TOMOGRAPHY OF NANOENGINEERED THIN FILMS

CROSS-REFERENCE TO RELATED APPLICATIONS

This application claims the benefit of U.S. Provisional Application No. 60/994,031, filed on Sep. 14, 2007. The entire disclosure of the above application is incorporated herein by reference.

GOVERNMENT SUPPORT

This invention was made with government support under Grant Number CMS0528867 awarded by the National Science Foundation. The government has certain rights in the invention.

BACKGROUND AND SUMMARY

This section provides background information related to the present disclosure which is not necessarily prior art. This section further provides a general summary of the disclosure, and is not a comprehensive disclosure of its full scope or all of its features.

The emerging field of nanotechnology puts forth nanomaterials with desired mechanical, electrical, and chemical functionality at the macroscopic scale. Advances in the field have aided the development of multifunctional materials that are capable of achieving several functional goals within a single platform, such as displaying mechanical strength coupled with sensing and actuation capabilities. Much interest has surrounded the development of carbon nanotube (CNT) composites which are commonly composed of single-walled (SWNT) and multi-walled carbon nanotubes (MWNT) embedded within a polymer matrix. CNT composites take advantage of the impressive mechanical, electrical and physical properties of individual nanotubes to produce materials endowed with similar bulk properties. For example, mechanically strong CNT composites that simultaneously exhibit conductivity changes to external stimuli (i.e. to pH, strain, humidity and light) have been reported, thereby allowing the material to be used in a variety of sensing applications.

The development of multifunctional CNT composites for sensing applications hinges on accurate monitoring of the bulk electrical properties of the material before, during and after exposure to external stimuli. Various measurement techniques have been widely used to quantify the resistance of solid state and thin film materials. Most common are direct current (DC) techniques where a constant current, I, is injected into a sample while the voltage, V, across the sample is measured. If the points of current injection and voltage measurement are collocated, the approach is termed the two point probe method. If the sample resistance, R, is low, contact impedance of the probes can introduce measurement errors. To minimize the influence of contact impedance, the four-point probe method separates the points of current and voltage measurements to acquire a more accurate measurement of sample resistance. Using knowledge of the specimen geometry (e.g. film thickness), bulk material conductivity, $\sigma$, can be calculated using the measured resistance, R.

To more precisely analyze the electrical properties of materials whose resistance is dependent on the frequency of an applied alternating current (AC), electrical impedance spectroscopy (EIS) can be used in lieu of DC probe methods. In EIS, the amplitude and phase relationship between an applied AC signal and the measured voltage is encapsulated within an impedance measurement, $Z(\omega)$, where $\omega$ is the cyclic frequency of the injected current. Impedance is a complex valued electrical property of the specimen with the real and imaginary impedance components dependent upon the resistance and capacitance of the specimen, respectively.

An inherent limitation of both DC probe and EIS methods is the assumption of relative homogeneity of the specimen's electrical properties between probe points. Should the electrical properties of a specimen be spatially inhomogeneous, both methods average the spatial variations to provide an equivalent homogeneous resistance or impedance measurement. To offer spatial resolution of specimen resistance, adaptations of the DC probe methods have been offered. Scanning four-point probe methods have been proposed with probe measurements repeatedly made at equally spaced probe locations defined by a grid. This method can be scaled down into a scanning electron microscope (SEM) environment to offer a spatial resolution of a few microns.

Other established techniques include scanning spreading resistance microscopy which consists of a conductive atomic force microscope tip that measures spreading resistance profiles across a specimen cross section. While such methods provide a mapping of resistance over multiple dimensions, they require repeated time-consuming measurements that are conducted at the macro- or microscales. With the emergence of multifunctional thin film composites capable of sensing stimuli such as strain and pH, there is a need for analytical methods that can map the thin film resistance over multiple spatial dimensions. According to the principles of the present teachings, a novel approach to mapping the distribution of conductivity of CNT composites based upon electrical probing at the specimen boundary is described. Termed electrical impedance tomography (EIT), the method has been successfully applied in other fields including medical imaging of cancerous growths in animal tissue. The method differs from scanning probe methods since electrical measurements need only be taken at the boundary of a specimen. Based on voltage measurements taken at the film boundary when an AC signal is applied, EIT inversely solves the Laplace equation to reconstruct a two-dimensional (2D) map of the specimen conductivity within the measured film boundary. EIT is especially powerful in applications where the CNT composite is implemented as a sensing skin, since mapping of film conductivity provides direct spatial depictions of the external stimulus inducing the conductivity changes. According to the principles of the present teachings, the theory of conductivity reconstruction by EIT is presented followed by its implementation on layer-by-layer assembled carbon nanotube composite thin films. The method is validated by intentionally manufacturing films with defects consistent with non-uniform conductivity distributions. Furthermore, the use of nanotube-based composite thin films as a sensing skin is illustrated by mapping changes in film conductivity to different pH environments using EIT.

It should also be understood that the challenges associated with managing aging civil infrastructures, aerospace, and mechanical engineered systems demand new sensing technologies to ensure long-term safety and reliability. In addition, harsh operational and environmental conditions coupled with the lack of robust monitoring and maintenance schemes often accelerate structural degradation. In extreme cases, undetected structural damage such as impact damage, corrosion, and fatigue can lead to catastrophic system failure. For instance, undiagnosed corrosion of aircraft fuselages can result in over-stressing of rivets and stress-corrosion crack formation; an example of what can occur if damage is left undetected is the Aloha Airlines plane which ripped apart in-flight in 1988. More recently, impact damage compromised the integrity of the thermal insulation heat shield of the Columbia Space Shuttle which exploded during re-entry. In addition to such fatal catastrophic structural failures, an abundance of economic resources are dedicated to inspecting and repairing existing structures. For example, the United States Air Force Corrosion Prevention and Control Office (AFCPCO) estimates that more than $800 million is invested annually for corrosion maintenance of its aeronautical fleet. Even greater financial resources are invested annually to maintain the national inventory of bridges, pipelines, and other large civil infrastructure systems.

As a means to mitigate the economic burden of structural maintenance and the risk of catastrophic failures, the field of structural health monitoring (SHM) offers a diverse suite of sensing and algorithmic technologies that identify structural degradation so as to facilitate timely repairs. While many SHM techniques have been proposed, the majority relies on correlating changes in global structural properties to damage. In order to detect component level damage, techniques such as modal frequency analysis are often not sufficiently sensitive to local structural variations such as damage. While strain gages can be installed to obtain local structural measurements, their main disadvantage is that they can only provide response data at one discrete location in the structure. Accurate damage detection requires either a dense network of these point-sensors or accurate models for extrapolating localized strain fields to the remainder of the structure.

As opposed to relying on global-based SHM methods, guided-waves show tremendous promise for damage detection and localization in thin metallic structures. With ultrasonic waves able to propagate over long distances, this sensing approach provides the sensor with a large interrogation zone. For instance, Giurgiutiu, et al. bonds multiple arrays of surface-mounted piezoelectric transducers onto aluminum alloy aircraft panels for generating Lamb waves to detect cracks and corrosion damage. Using piezoelectric sensor/actuator responses, reflected echo signals are employed for accurate detection of damage due to hairline slits, seeded cracks, and impact. Similarly, Park, et al. has validated piezoelectric patches for identifying cracks developed in welded zones of ⅛-scale bridge truss members. Simulated damage by loose bolts and induced cracks are successfully detected via a Lamb-wave approach combined with a prescribed damage threshold index. On the other hand, when combining distributed piezoelectric sensors/actuators with a wavelet-based data processing technique, Sohn, et al. identifies the location of delamination within large 61×61 cm2 composite plates. While the aforementioned guided wave techniques are fairly robust for identifying damage in simple structural components, computational demand increases dramatically and accuracy decreases when structural geometries are complex and when multiple damage sites are within the active sensors' interrogation zone. In addition, a dense network of piezoelectric sensors and actuators, combined with computationally-intensive algorithms, are still required for detecting small damage features. Moreover, application of guided-waves on complex structures generally requires a priori geometrical knowledge of the undamaged structure to distinguish structural features from detected damage.

More recently, advances in nanotechnology have brought forth new materials and fabrication tools for developing high-sensitivity thin film sensors that are suitable for use in SHM. In fact, carbon fullerenes and nanotubes show tremendous potential for use in multifunctional materials. For example, it has been shown that single-walled carbon nanotubes (SWNT) possess a Young's Modulus of approximately 1 TPa and exhibit near ballistic transport-type electronic conductivities. The strength characteristics of SWNTs have led to many exploring their use for reinforcing polymeric and ceramic materials. While mechanical durability is one desirable attribute of carbon nanotube composites, another is the embedment of sensing functionalities. Specifically, the large surface area and high aspect ratio of SWNTs are ideally suited for chemical functionalization; binding molecules to the surface of SWNTs allow electromechanical and electrochemical sensing transduction mechanisms to be encoded into a carbon nanotube composite.

According to the principles of the present teachings, SWNTs are employed as a building block for the design and fabrication of multifunctional "sensing skins" that are capable of monitoring structural damage without having to probe multiple discrete sensor locations to infer the characteristics (i.e., type, location, and severity) of damage. The proposed sensing skin seeks to: 1) spatially image deformations (strain), 2) identify and locate foreign object and blast debris impact, and 3) observe the formation of corrosion byproducts. Using a layer-by-layer (LbL) self-assembly process, individual SWNTs are functionalized with various polyelectrolyte species for embedding multiple sensing transduction mechanisms within the composite's morphology. Here, SWNT-based LbL nanocomposites are embedded with strain sensitivity and corrosion detection capabilities. It will be shown that applied strain, impact damage, and corrosion byproduct formation alter thin film conductivity, thereby enabling a multifunctional composite capable of monitoring common structural damage processes. Unlike other carbon nanotube-based films cast by vacuum filtration, thermal evaporation, annealing, or epoxy-molding, LbL-based nanocomposites exhibit high deformation tolerance (up to 10,000µε), robust field survivability, and highly uniform morphology. Realization of a sensing skin with spatial resolution is achieved by coupling the nanocomposites with an electrical impedance tomographic (EIT) spatial conductivity imaging technique. In short, the EIT conductivity mapping technique relies on repeated electrical measurements at the film boundary so as to inversely reconstruct the skin's spatial conductivity distribution. Since the LbL-based sensing skin is embedded with specific sensing transduction mechanisms, changes in film conductivity can be directly correlated to strain, impact, corrosion, pH, among others.

The present disclosure begins with a brief introduction to electrical impedance tomography. Then, the layer-by-layer skin fabrication process is described in detail. Finally, the carbon nanotube sensing skins are experimentally validated to detect tensile-compressive cyclic strains, impact damage, and corrosion byproduct formation in typical metallic structural components.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 is a schematic drawing illustrating the electrical impedance tomography spatial conductivity reconstruction process of the present teachings, with the left side of the schematic shows the nature of the inverse problem (i.e., using boundary electrical measurements and known current inputs to find the conductivity distribution of the sensing skin), where in order to solve for the spatial conductivity distribution, an iterative process utilizing the finite element method is employed to repeatedly solve the forward problem until the solution converges (minimization of the cost function);

Figure 4:
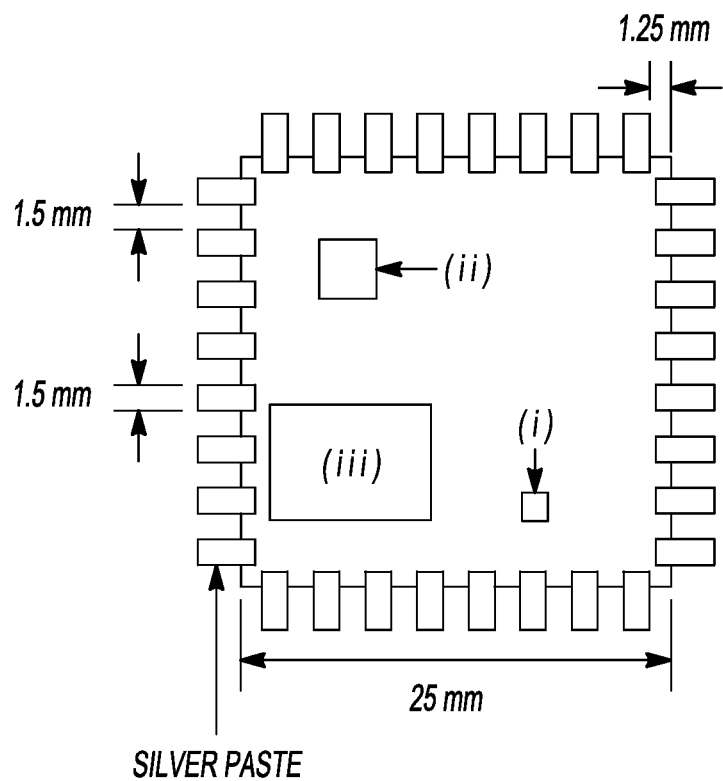
Figure 5:
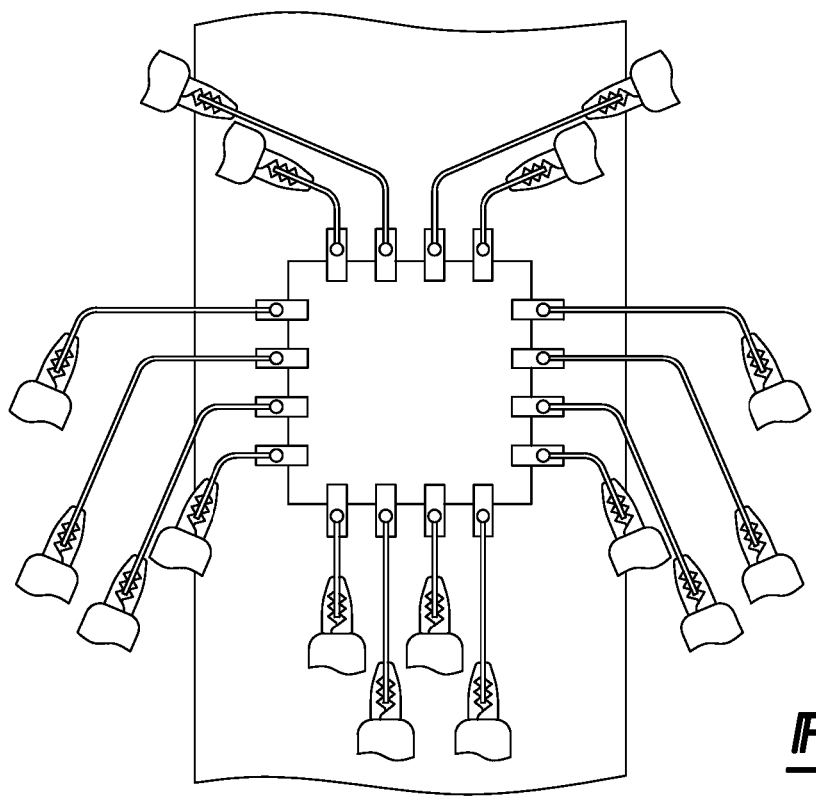
Figure 6B:
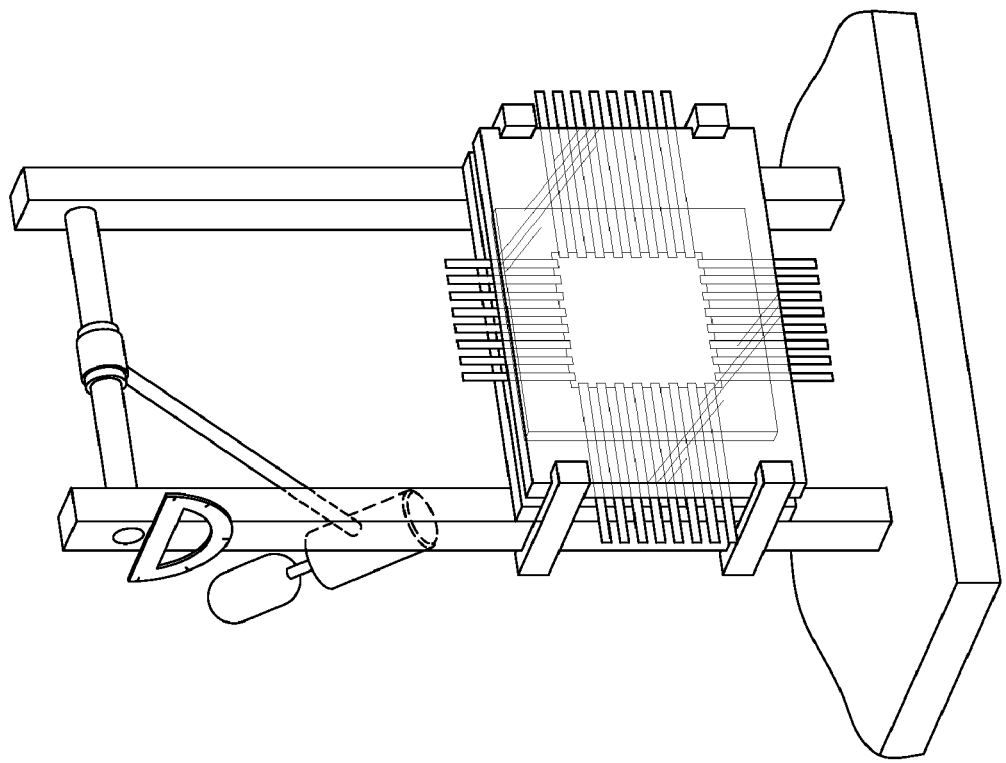
Figure 6A:
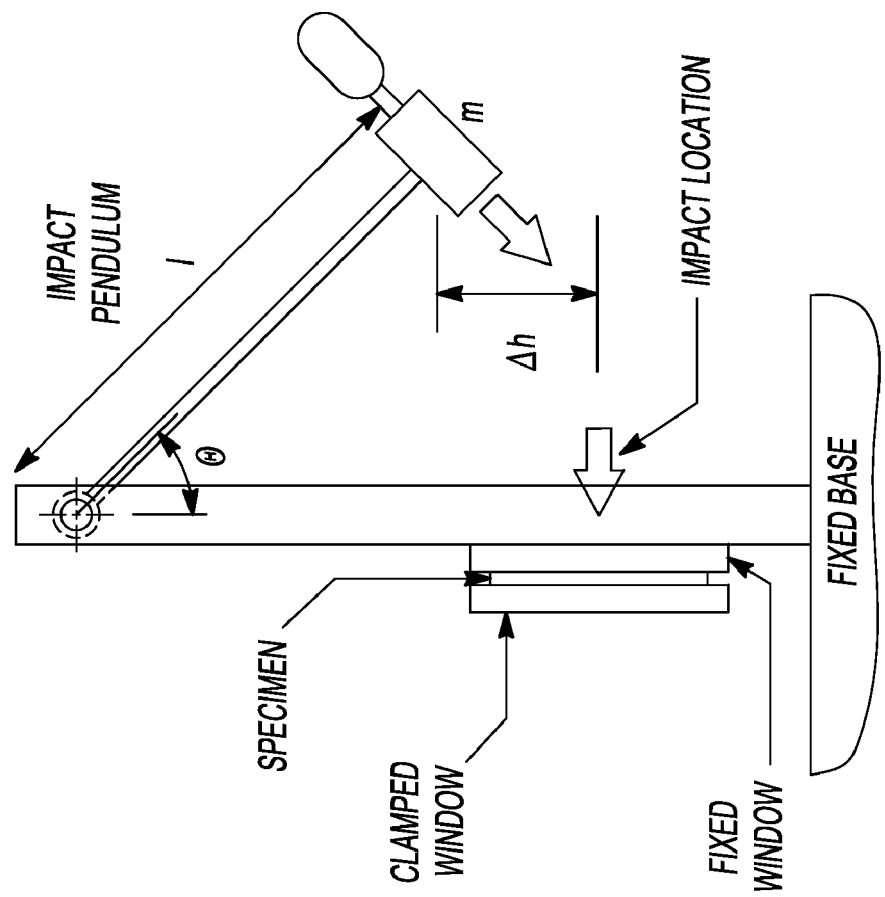
Figure 7B:
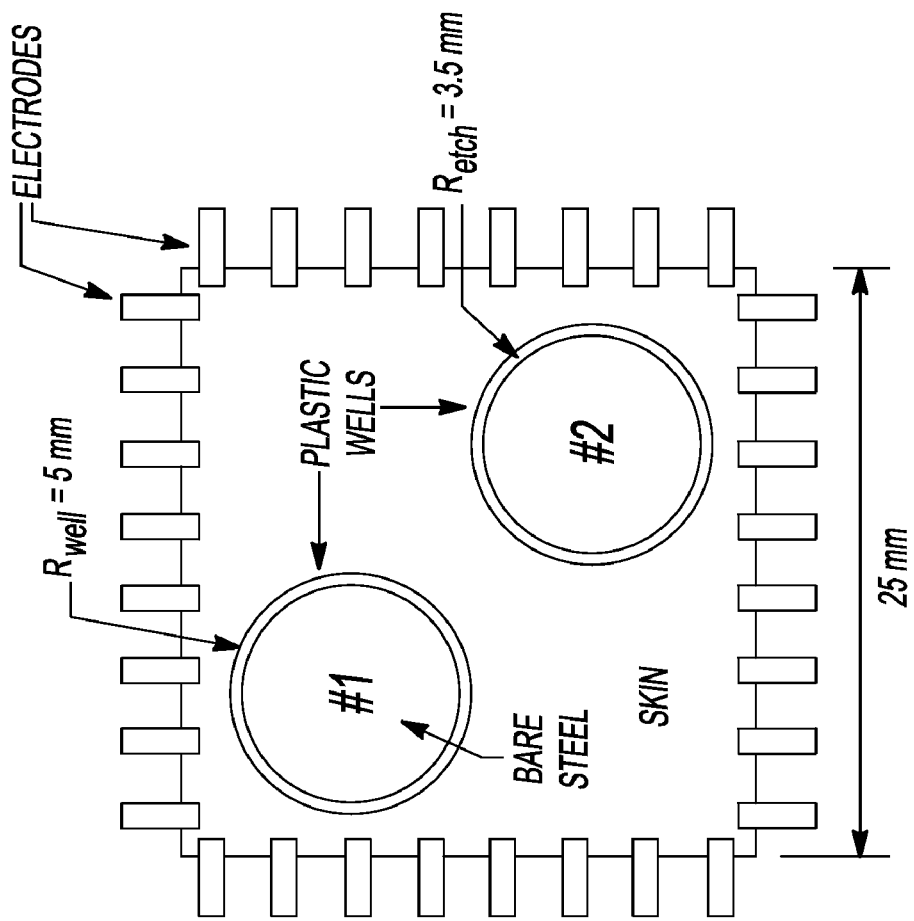
Figure 7A:
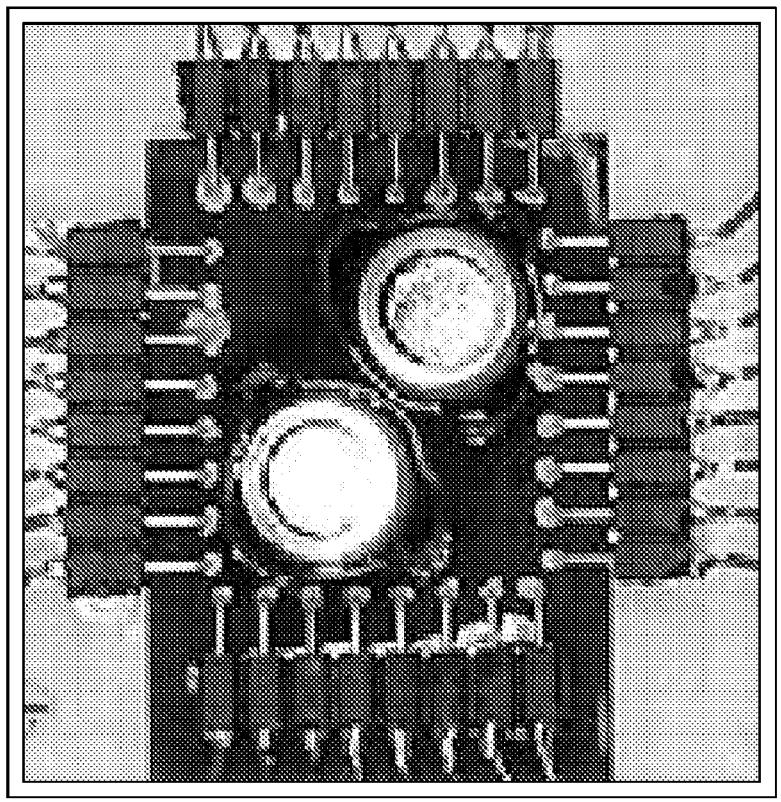
Figure 8B:
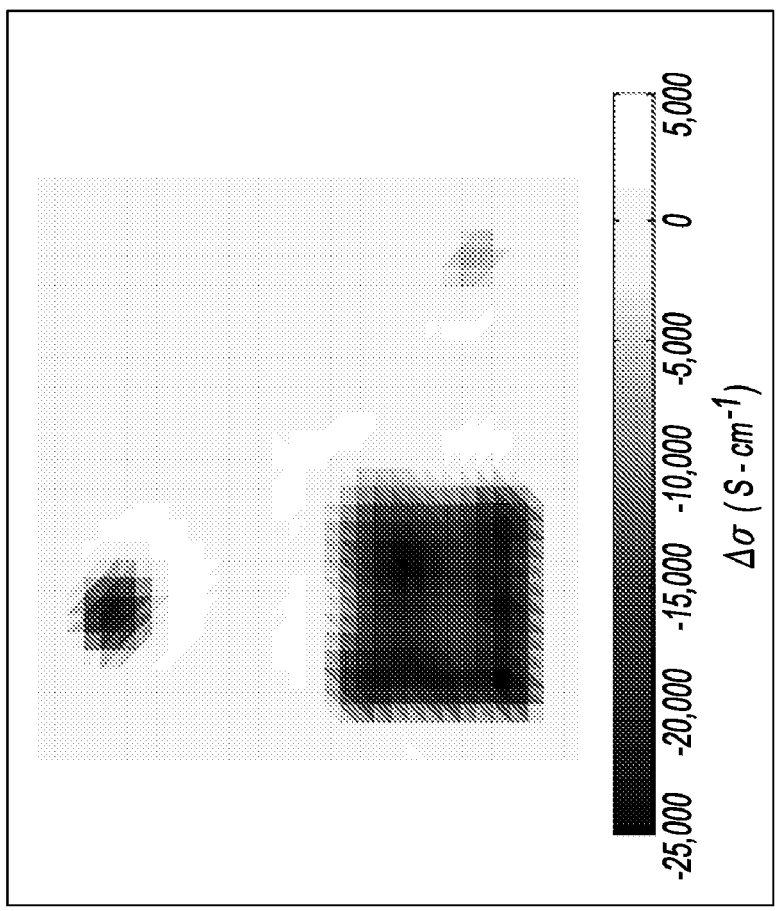
Figure 8A:
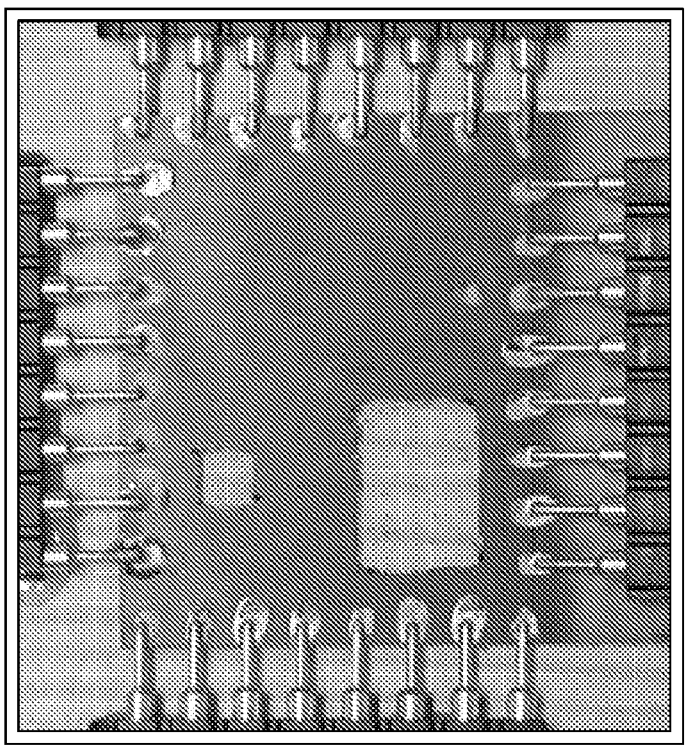
Figure 9:
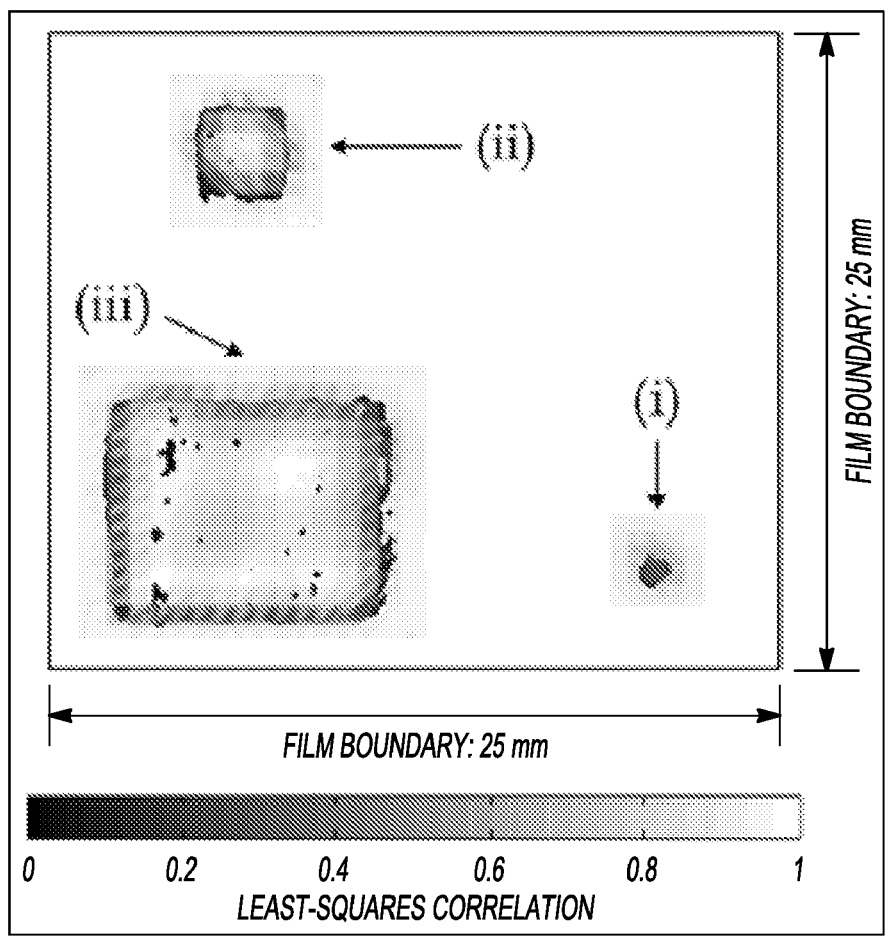

FIGS. 3A-3C are schematic drawings illustrating the EIT electrode configuration, wherein FIG. 3A illustrates strain sensing validation using (SWNT-PSS/PVA)$_{50}$ thin films deposited on 25×25 mm$^2$ glass substrates, FIG. 3B illustrates impact damage detection using (SWNT-PSS/PVA)$_{50}$ thin films deposited on 110×110 mm$^2$ primer-coated aluminum 6061-T6 alloy plates, and FIG. 3C illustrates accelerated corrosion tests using (SWNT-PSS/PVA)$_{100}$ thin films deposited onto 25×25 mm$^2$ primer-coated carbon steel plates;

FIG. 4 is a schematic drawing illustrating a (SWNT-PSS/PVA)$_{50}$ nanocomposite fabricated onto a glass substrate with three mechanically-etched windows having eight EIT electrodes (header pins and colloidal silver paste) established on each of the four boundaries of the 25×25 mm$^2$ thin film;

FIG. 5 is a photograph of (SWNT-PSS/PVA)$_{50}$ skins deposited on glass (with a total of 16 electrodes along the film's boundary) epoxy mounted onto PVC Type I coupons and mechanically loaded in an MTS-810 load frame, wherein the load frame is displacement-controlled to mechanically load the thin film to ±5,000µε, followed by a final monotonic tensile load pattern to induce cracking in the glass substrate;

FIG. 6A is a schematic view of an impact testing apparatus equipped with an adjustable arm pendulum (of length, l) and mass block (m), such that by controlling the height (Δh) of the pendulum arm, a specific amount of potential energy can be transferred to the plate during impact;

FIG. 6B is a photograph of (SWNT-PSS/PVA)$_{50}$ skins, deposited on aluminum 6061-T6 alloy, mounted onto an impact-loading test apparatus, where fixed boundary conditions are ensured by clamping a plexiglass frame over the skin and plate;

FIG. 7A is an illustration of two etched circular regions (Well #1 and Well #2) on the sensing skin-coated carbon steel substrate;

FIG. 7B is a photograph of the actual accelerated corrosion testing specimen with 32 boundary electrodes and two plastic wells mounted over the etched circular holes;

FIG. 8A is a photograph of a (SWNT-PSS/PVA)$_{50}$ specimen mechanically etched to selectively remove nanocomposite regions from three rectangular areas that correspond to FIG. 4;

FIG. 8B is an EIT spatial conductivity map showing the change in conductivity due to etching in FIG. 8A;

FIG. 9 is a least-squares correlation matrix [E] computed at the three rectangular areas where the skin has been etched illustrating the differences between the computed EIT spatial conductivity map (FIG. 8B) and the actual specimen (FIG. 8A) (perfect correlation is shown as white (Exy=1));

FIGS. 10A-10K is a series of (SWNT-PSS/PVA)$_{50}$ skins deposited onto glass substrates and epoxy-mounted to PVC coupons for load testing, wherein a one-cycle tensile-compressive load pattern (±5,000µε) is executed, 10A-10K EIT spatial conductivity mapping is conducted at 2,500µε increments to monitor the sensing skin's 2D conductivity change.

Figure 11:
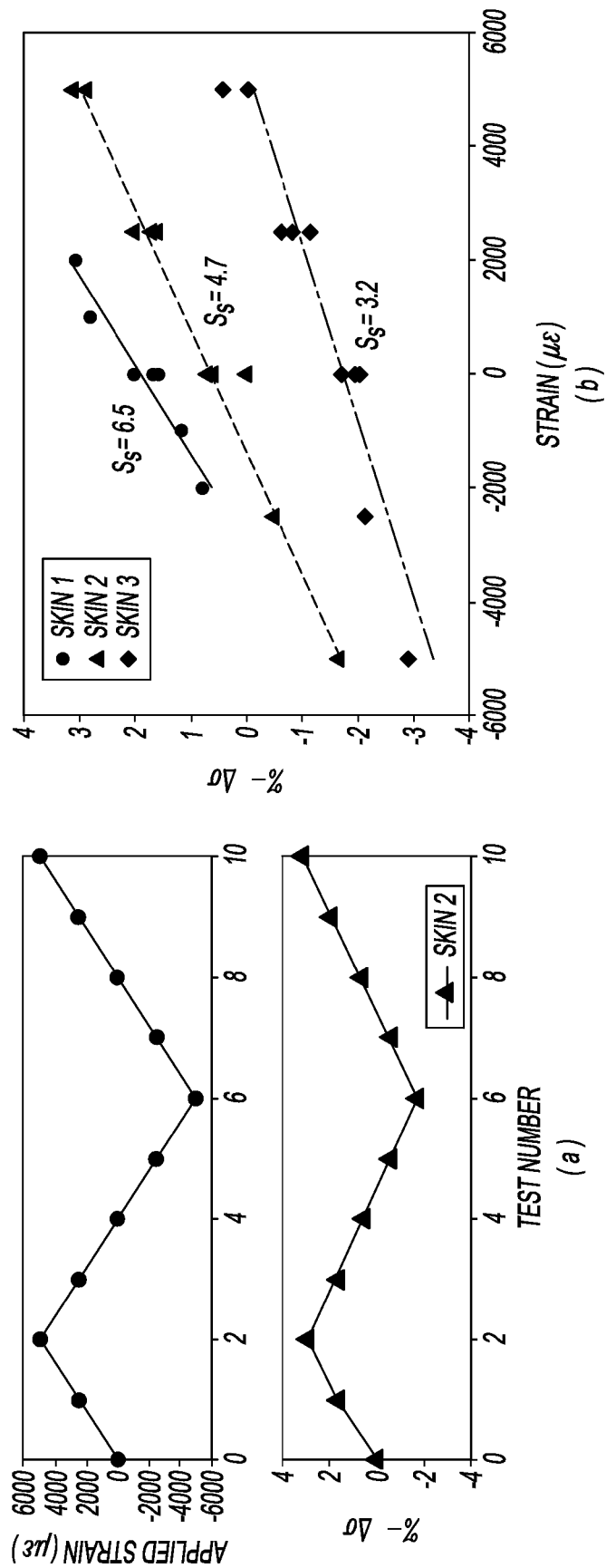

FIG. 11A is a graph illustrating a one-cycle tensile-compressive load pattern to ±5,000µε being applied to each sensing skin specimen, wherein the load frame is paused at 2,500µε to allow EIT data acquisition, further illustrating the strained sensing skin's percent change in conductivity changes in tandem with the applied strain.

Figure 13:
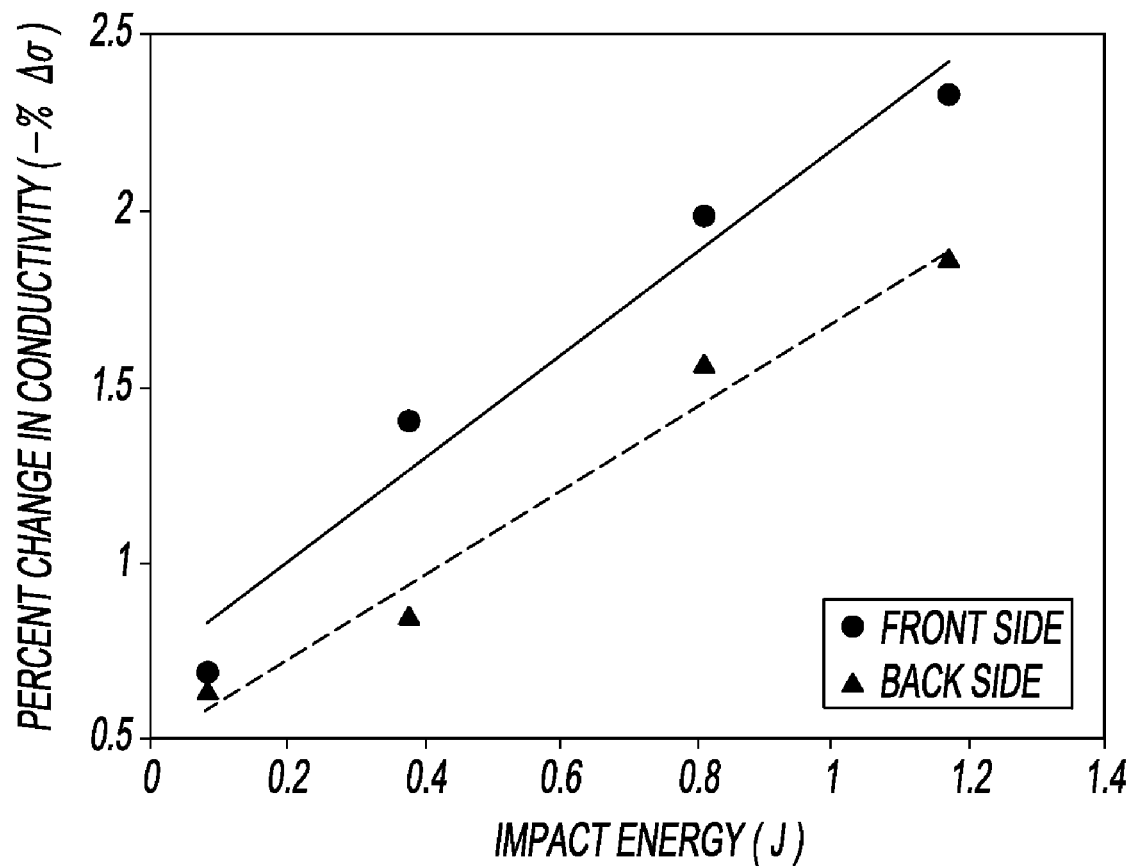
Figure 14:
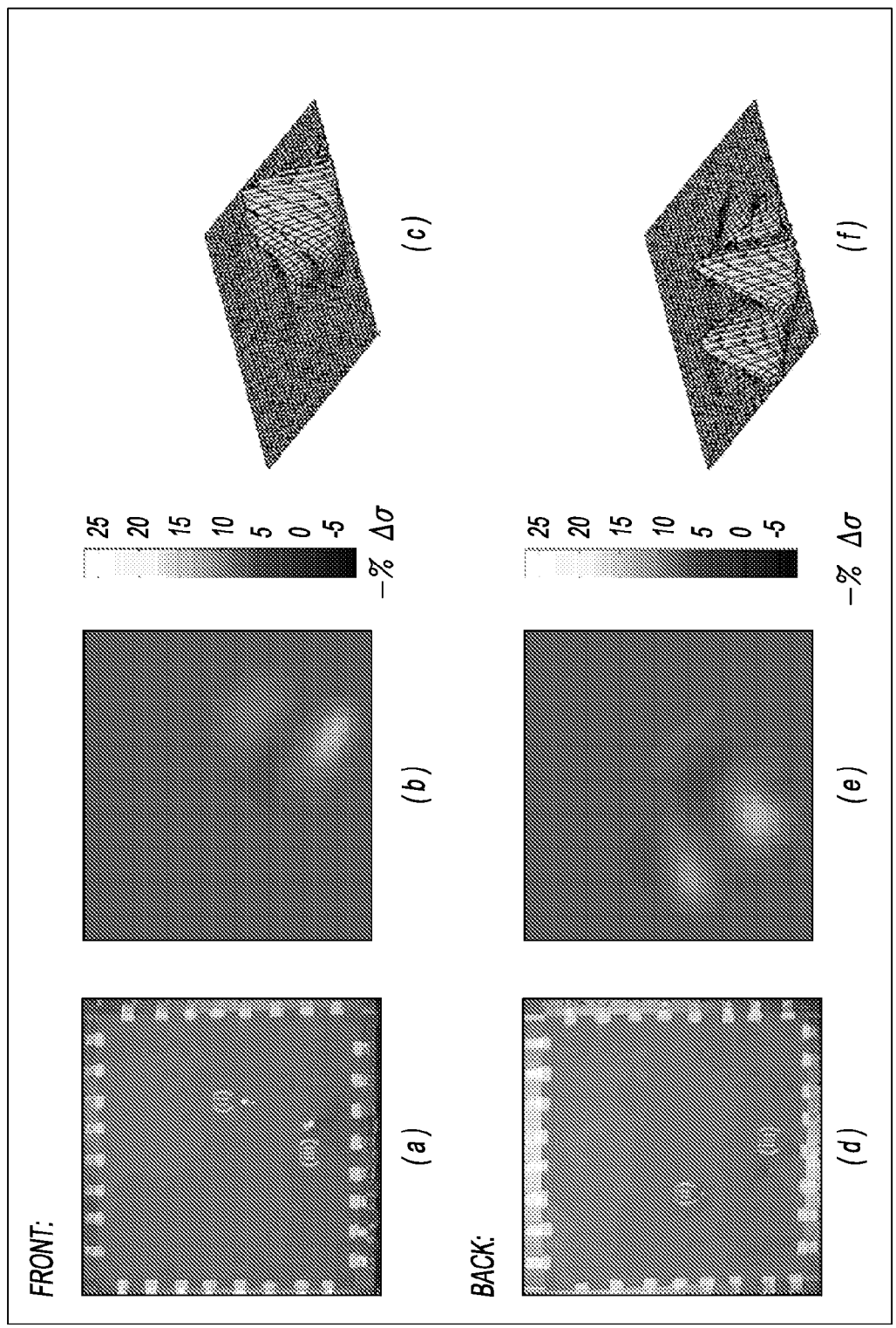
Figure 15:
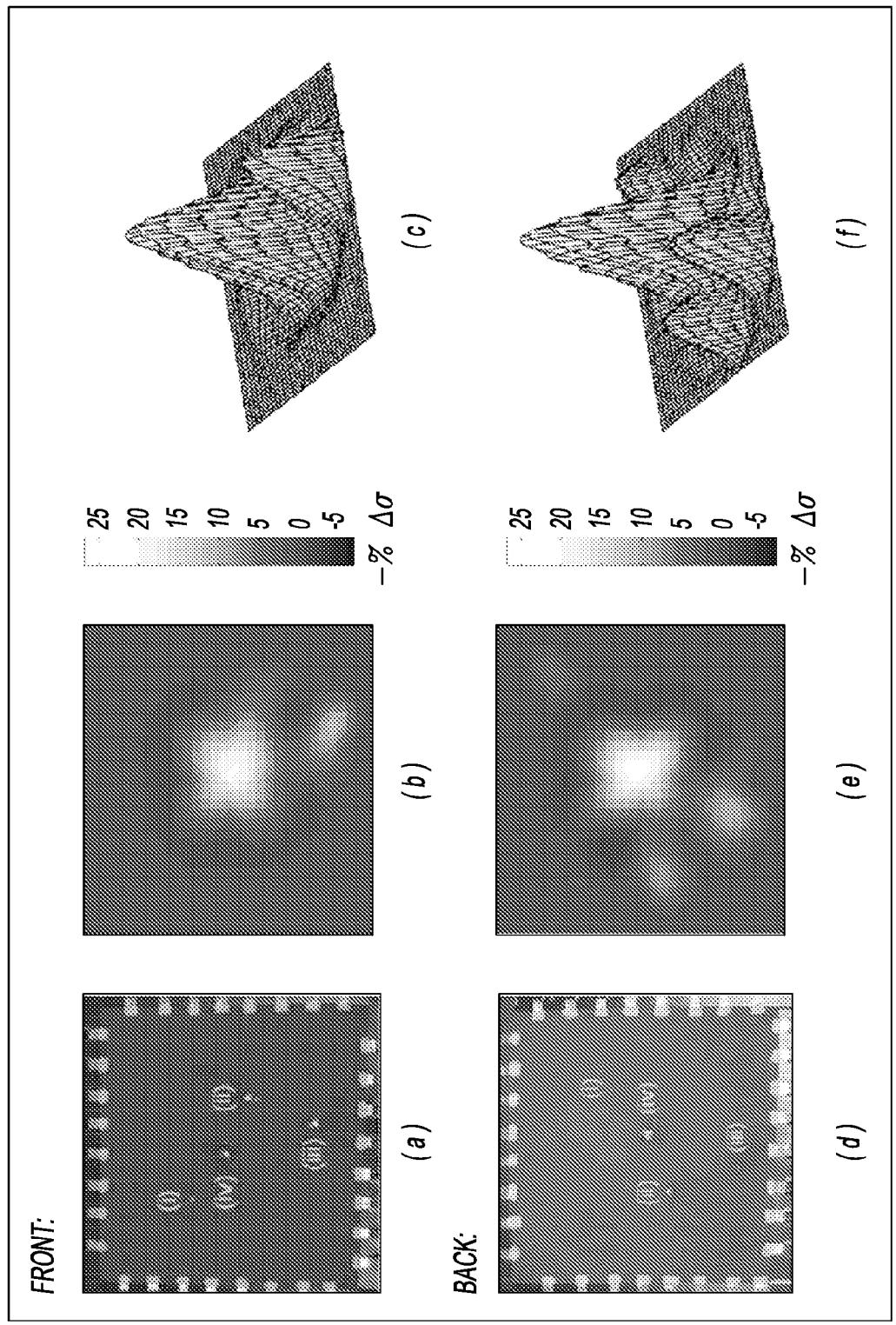
Figure 16:
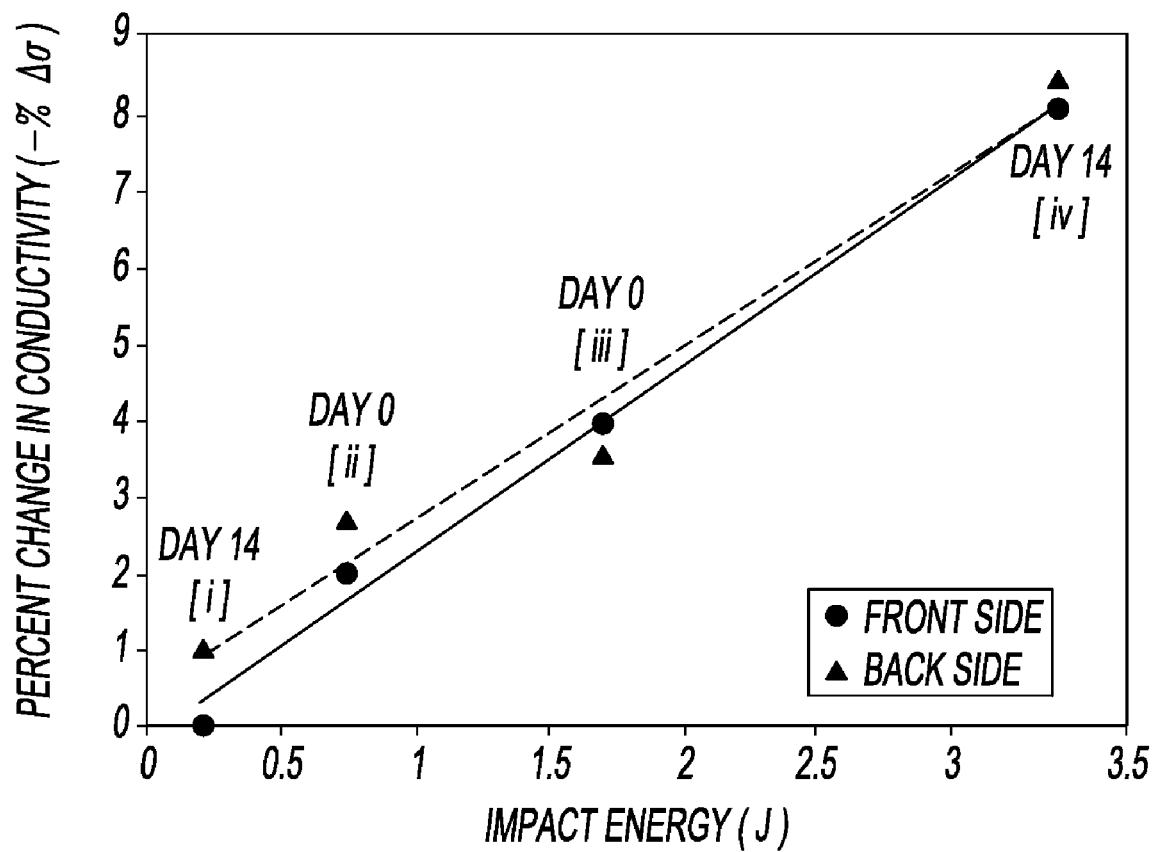
Figure 17:
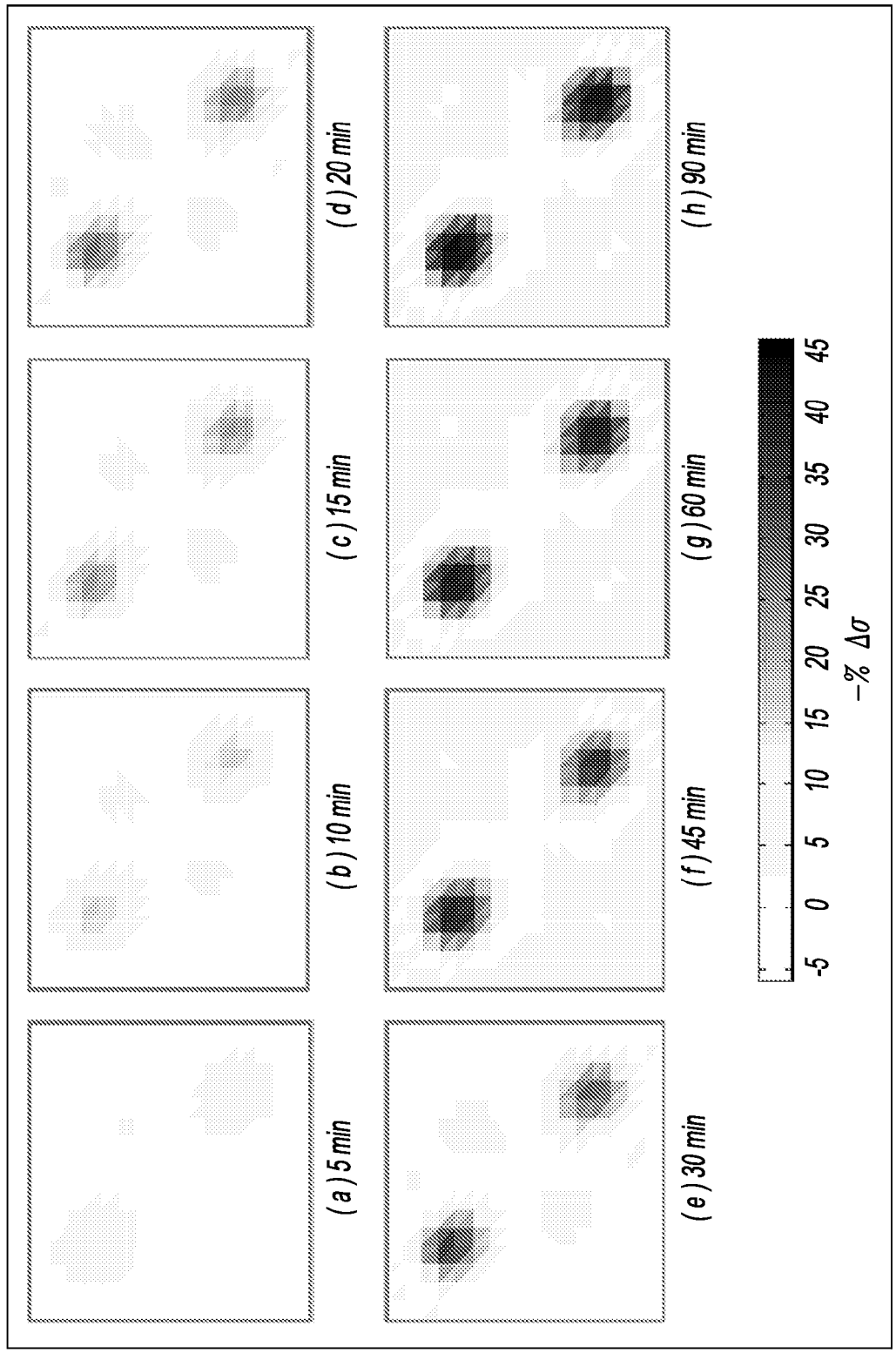

FIG. 11B is a graph representing a plot of the normalized change in average film conductivity (–% Δσ) against the applied strain for all skin specimens, the results confirming the skin's linear strain sensing performance;

FIGS. 12A-12F are spatial conductivity distributions after EIT is employed on Specimen IM-01 following four different magnitudes of controlled pendulum impacts [(i)-(iv)] for the front and back sides, respectively, wherein damage can be visually identified from photographs taken from the (a) front and (d) back sides of the plate such that the reconstructed front-side (b) 2D and (c) 3D representation and back-side (e) 2D and (f) 3D representation EIT spatial conductivity images all verify the sensing skin's impact damage detection capabilities;

FIG. 13 is a graph illustrating the percent change in average film conductivity of specimen IM-01 increases near-linearly with increasing impact energy (as controlled by the initial potential energy of the impact test apparatus pendulum), wherein the similarity in the fitted lines' slopes suggests that the sensing skins exhibits similar sensitivity to strain and impact;

FIGS. 14A-14F are spatial conductivity distributions after EIT is employed on Specimen IM-02 following two different magnitudes ([ii] 60° and [iii] 90°) for the front and back sides, respectively, wherein damage can be visually identified from photographs taken from the (a) front and (d) back sides of the plate such that the reconstructed front-side (b) 2D and (c) 3D representation and back-side (e) 2D and (f) 3D representation EIT spatial conductivity images all verify the sensing skin's impact damage detection capabilities;

FIGS. 15A-15F are spatial conductivity distributions after EIT is employed on Specimen IM-02 following a second test of two different magnitudes ([ii] 30° and [iv] 180°) for the top right corner and middle of the plate, wherein damage can be visually identified from photographs taken from the (a) front and (d) back sides of the plate such that the reconstructed front-side (b) 2D and (c) 3D representation and back-side (e) 2D and (f) 3D representation EIT spatial conductivity images all verify the sensing skin's impact damage detection capabilities;

FIG. 16 is a graph illustrating the percent change in average film conductivity of specimen IM-02 increases near-linearly with increasing impact energy (as controlled by the initial potential energy of the pendulum impact testing apparatus), wherein the time of inflicted impact damage are also denoted with each data point.

Figure 18:
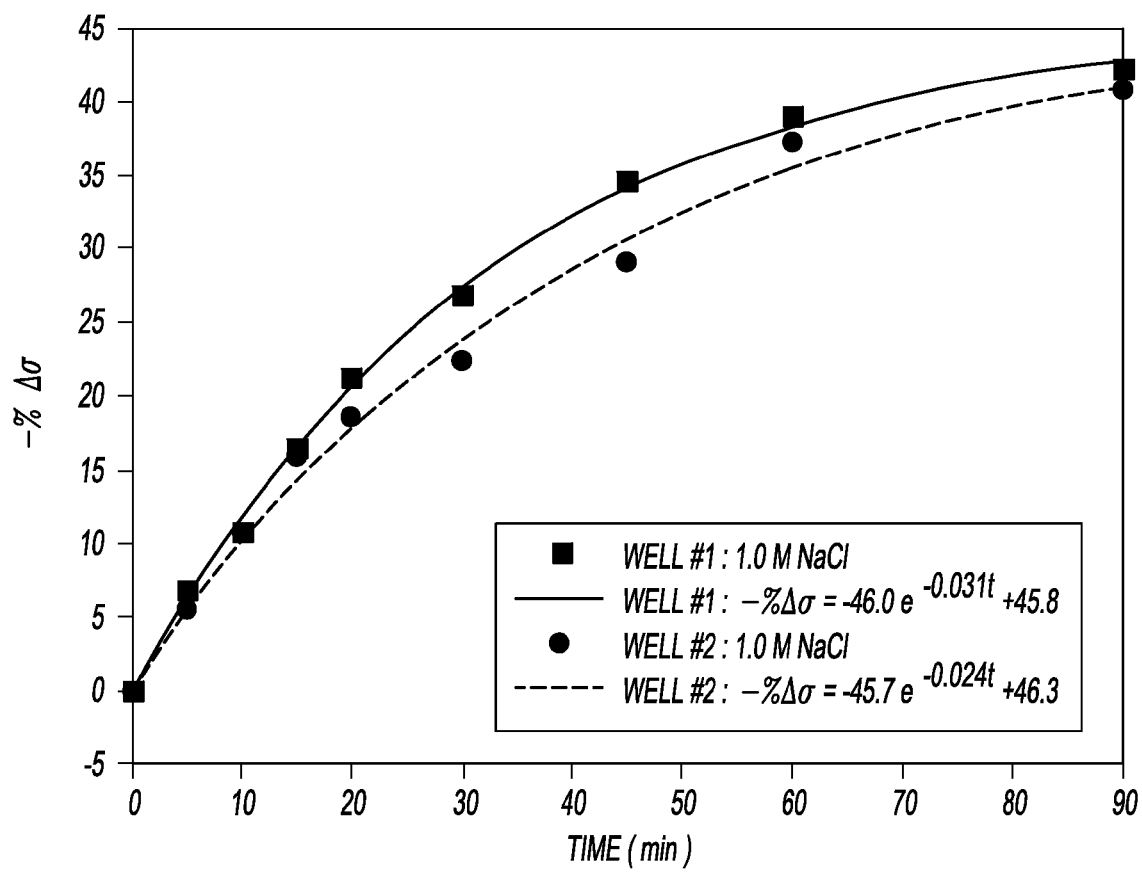
Figure 19:
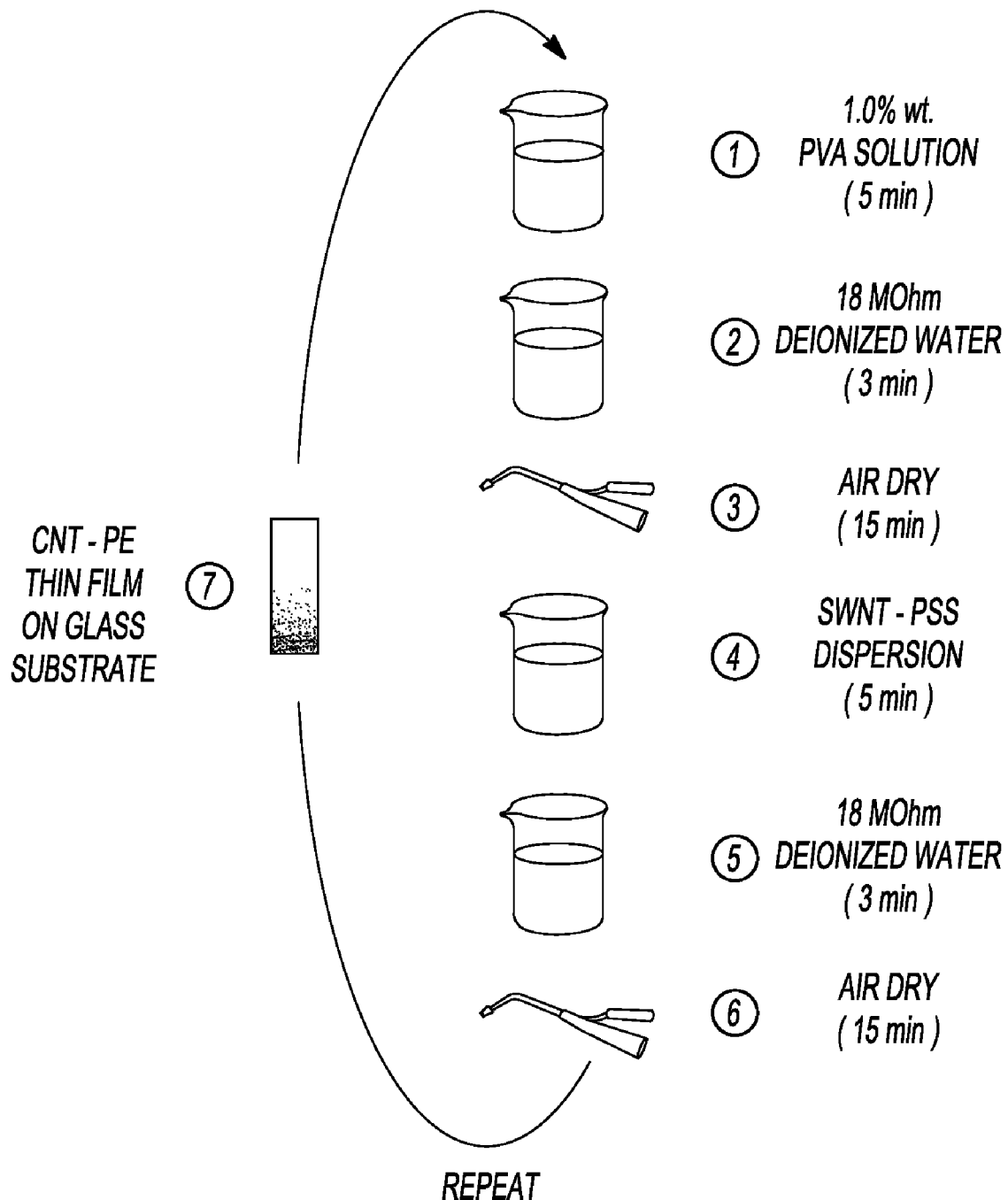
Figure 20:
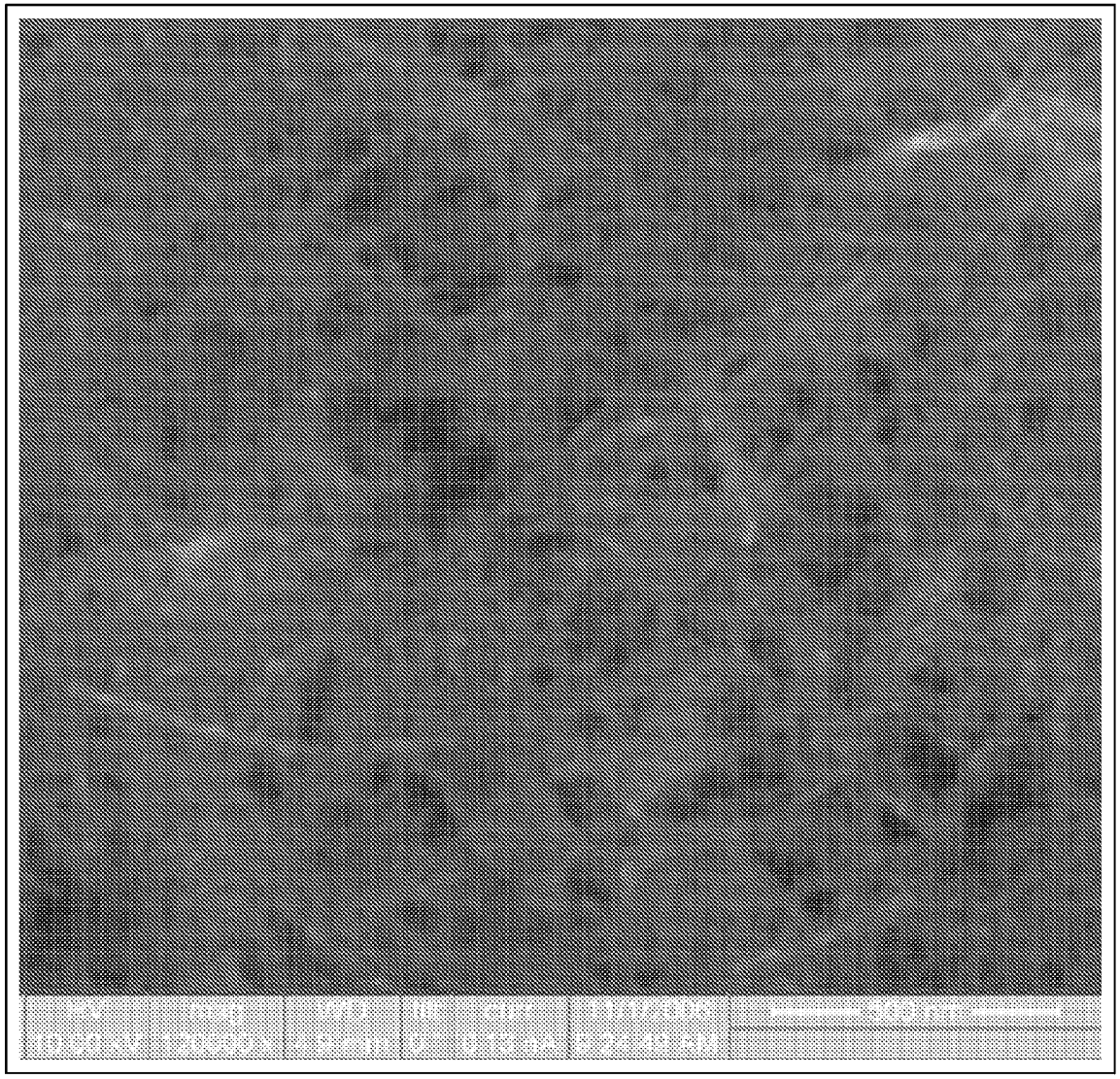
Figure 21:
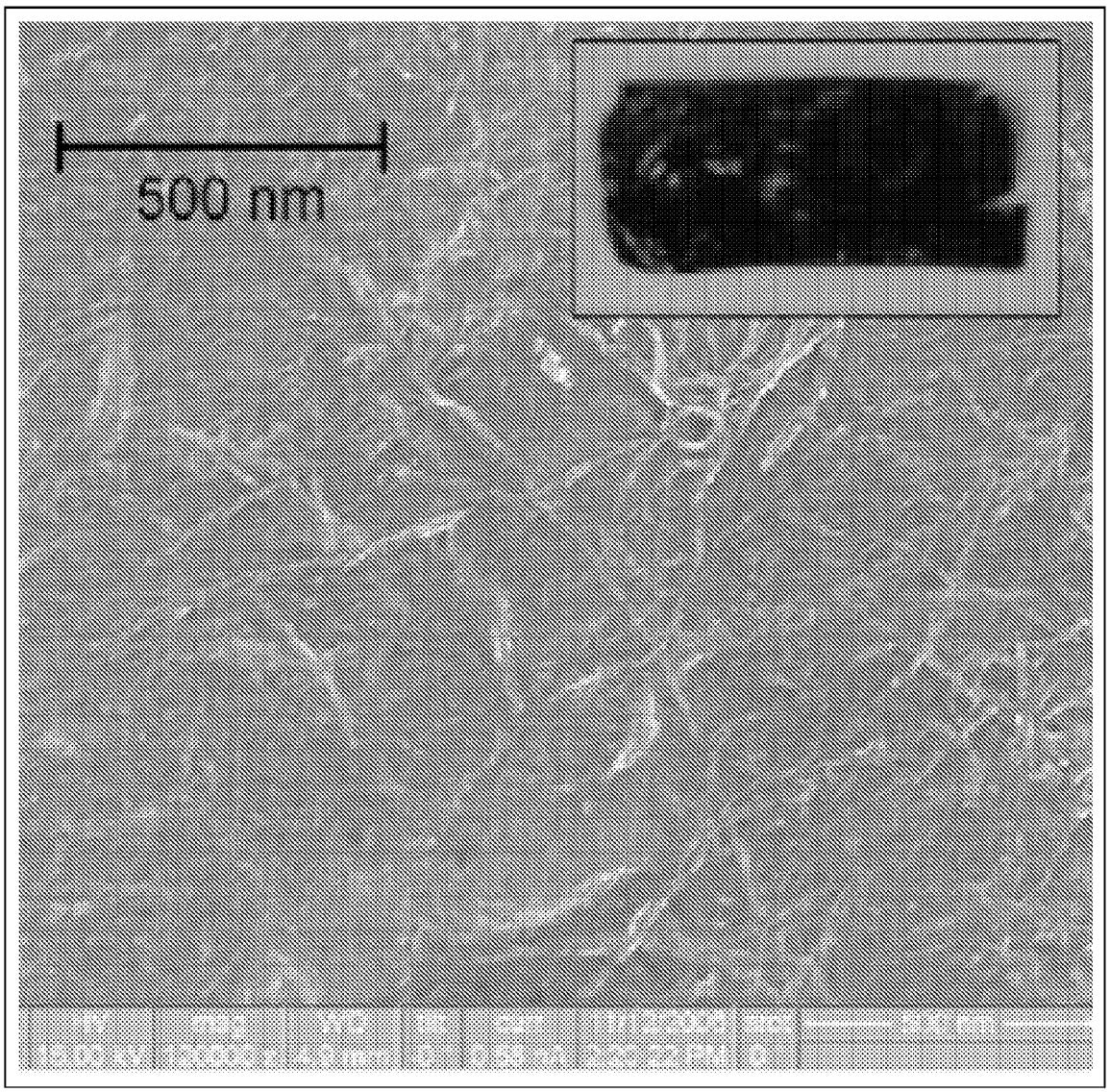
Figure 22B:
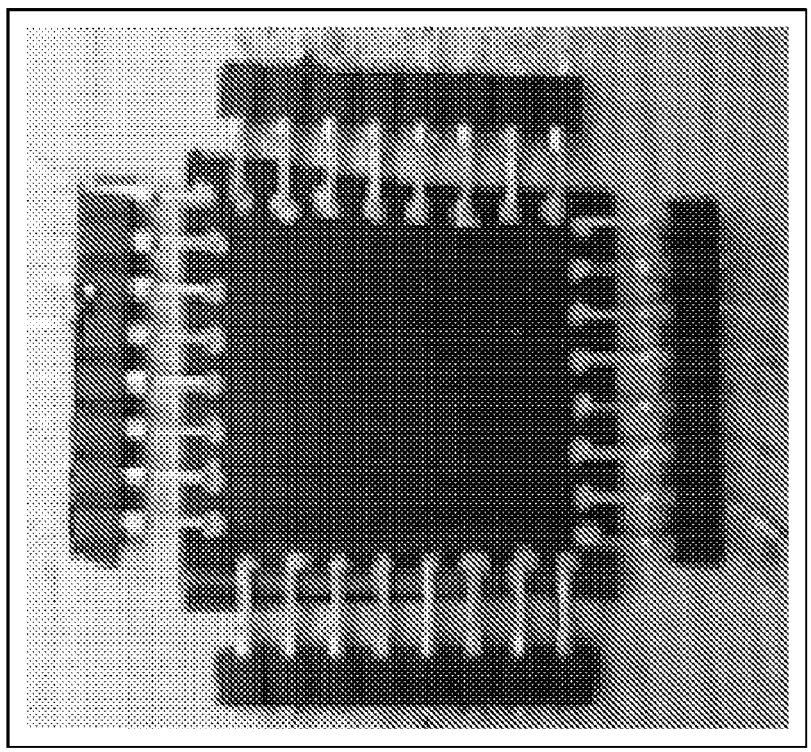
Figure 22A:
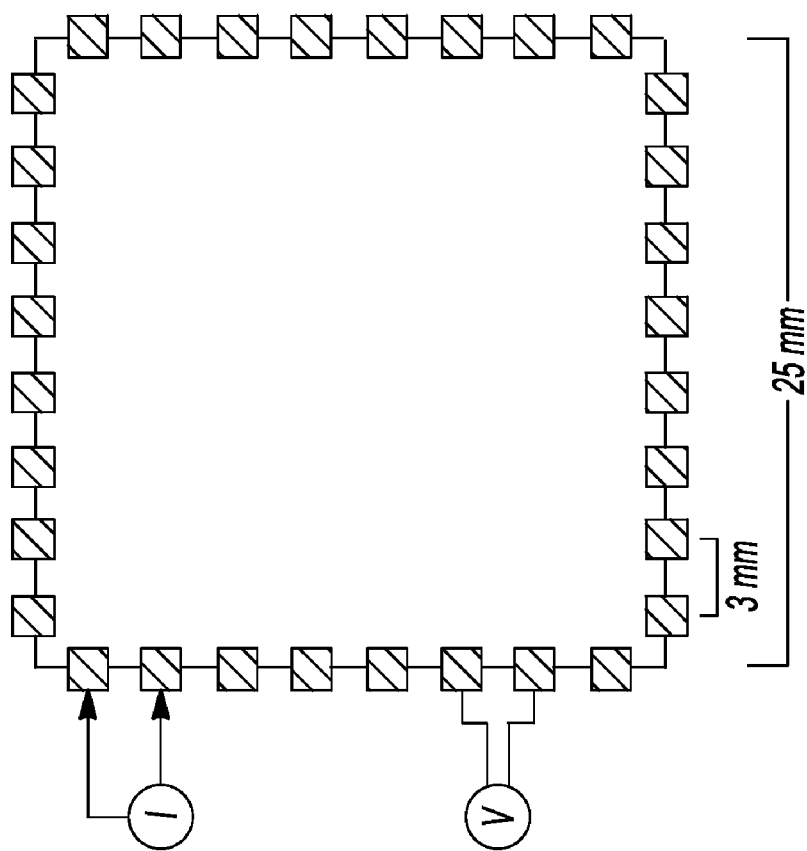
Figure 24:
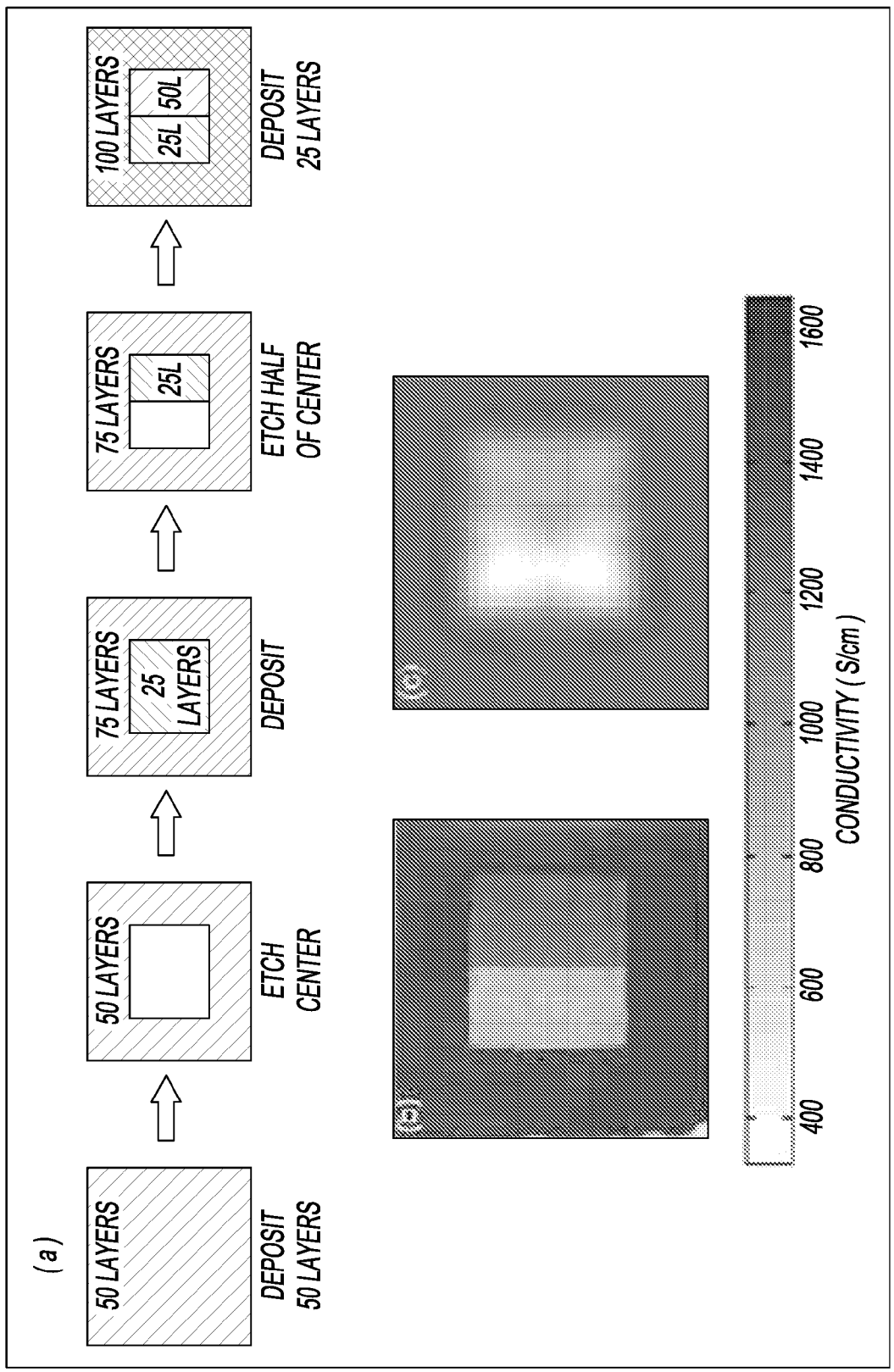
Figure 25:
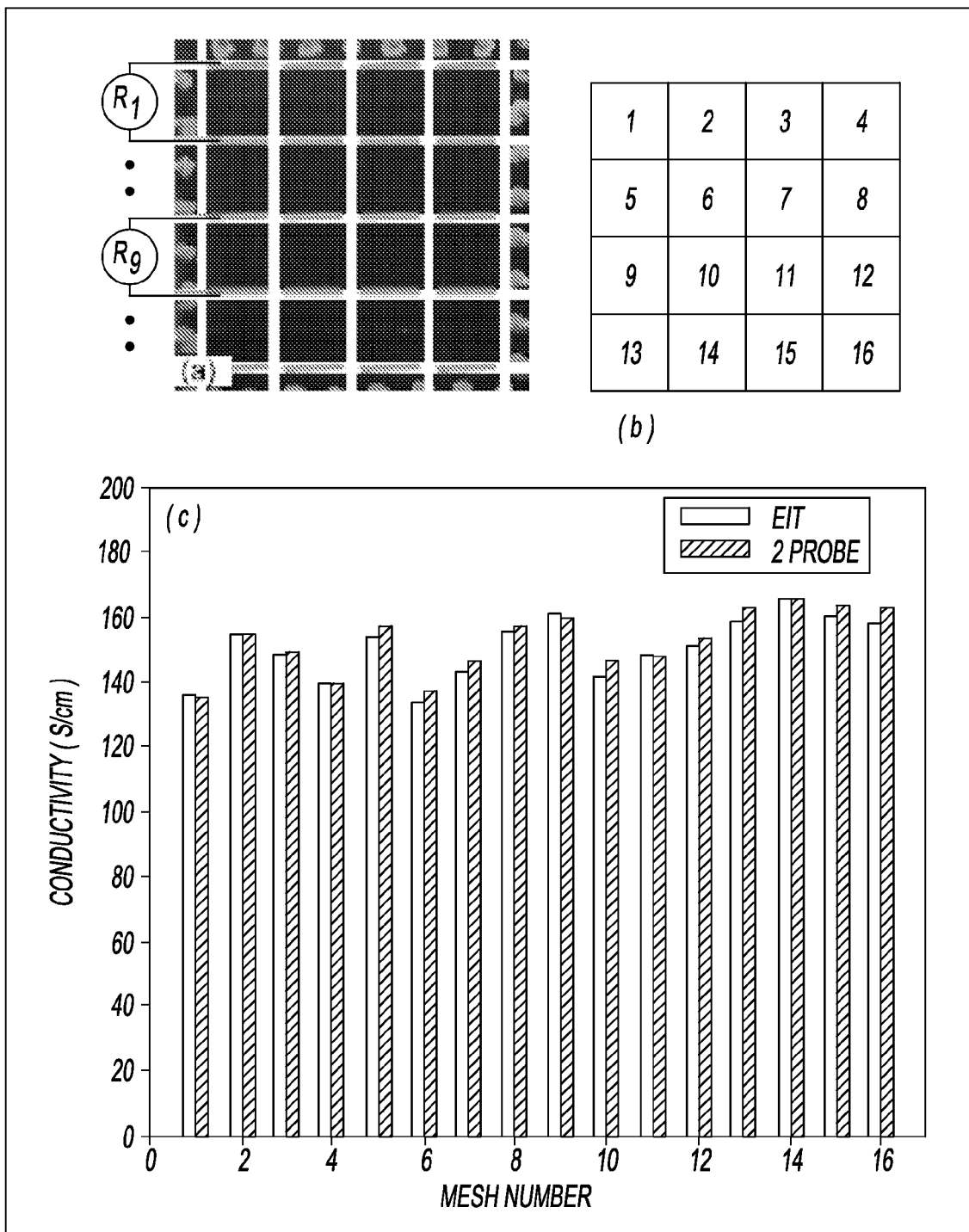
Figure 26:
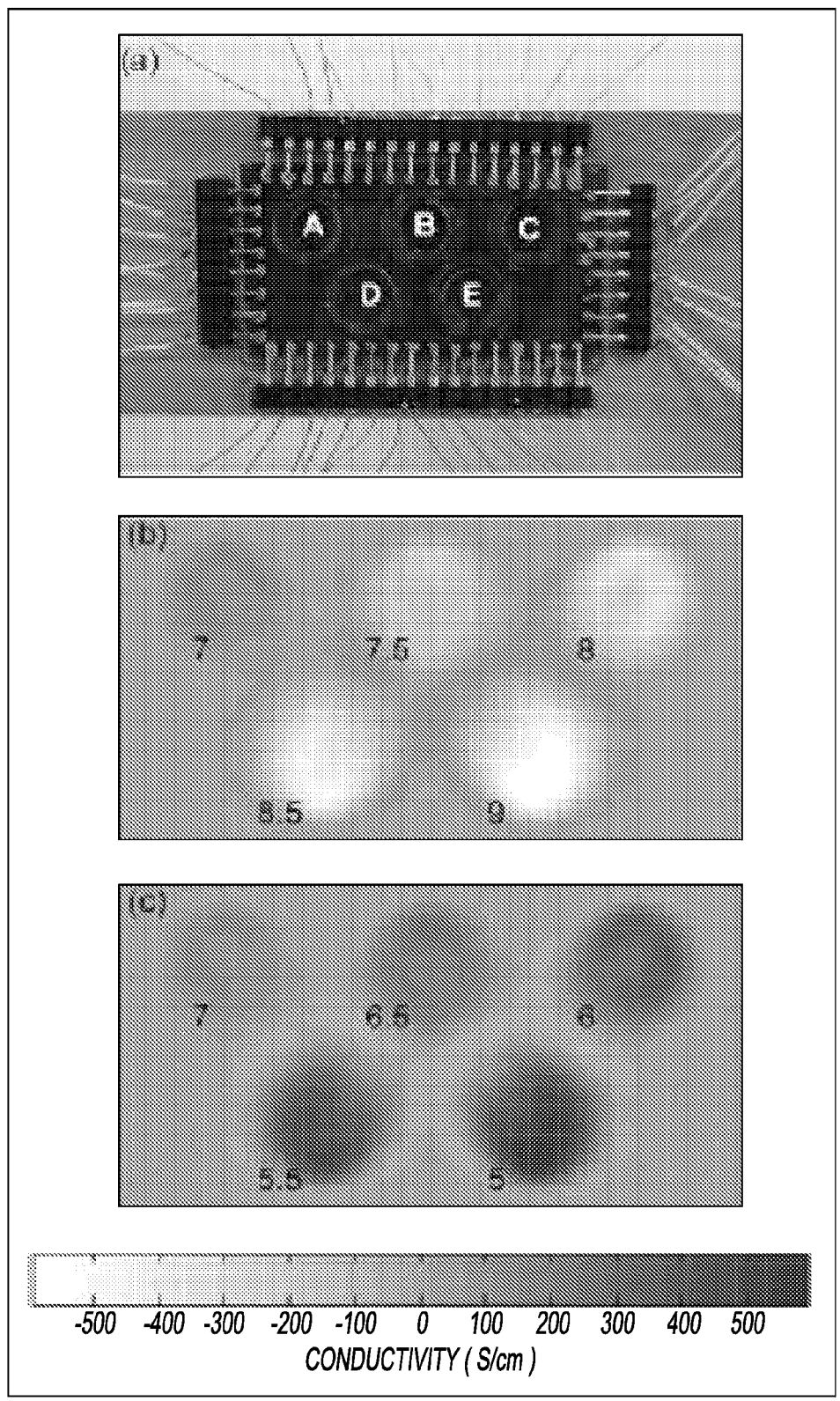
Figure 27:
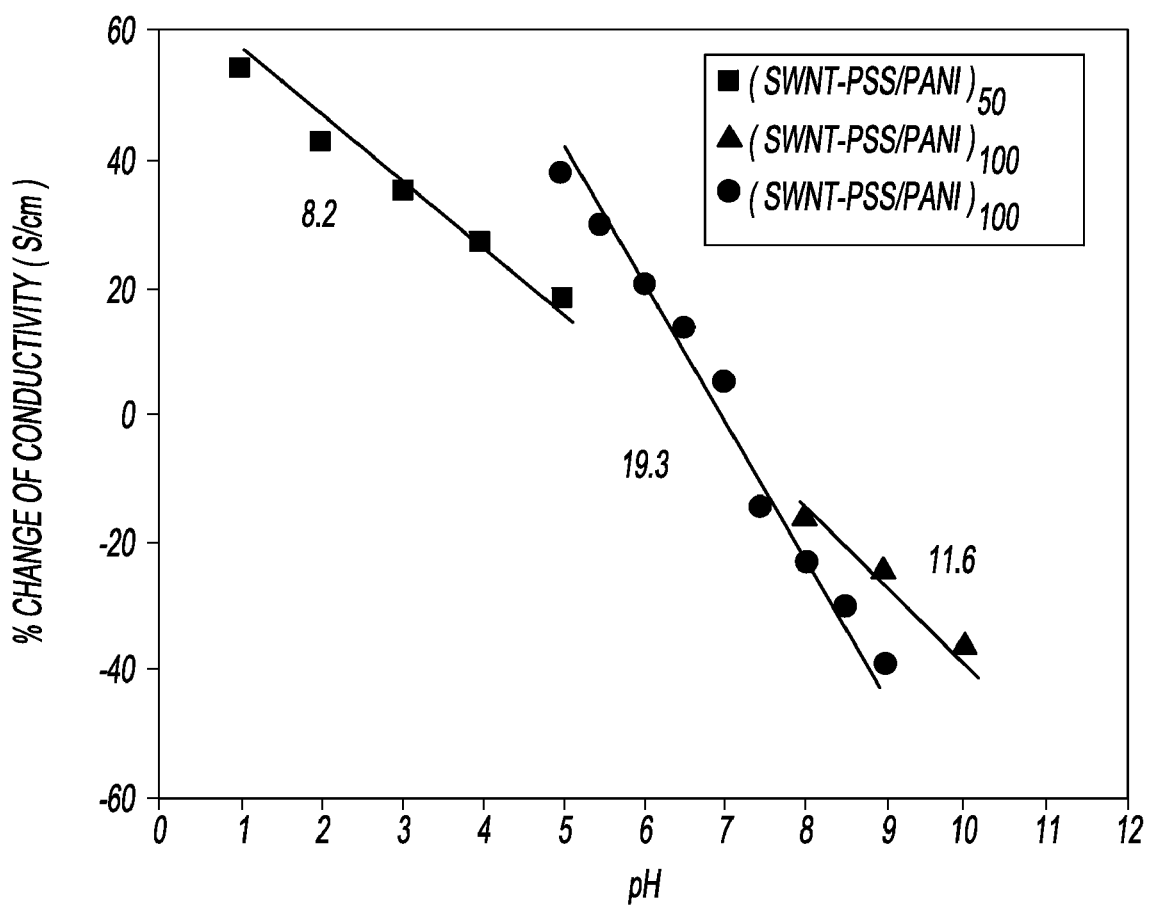

FIGS. 17A-17H is a series of EIT conductivity images between salt exposures, wherein the sensing skins are deposited onto primer-coated carbon steel employed to detect corrosion byproduct formation due to short-term exposure to sodium chloride solutions in two circular wells, wherein NaCl solutions are pipetted into each well for 5 min intervals, and the total exposure time varies between (a) 5 min to (h) 90 min;

FIG. 18 is a graph illustrating the EIT-computed well conductivities versus accelerated corrosion times which shows that both wells undergo similar corrosion rates and wherein the decay in corrosion rate suggests plateauing of corrosion byproduct formation after 60 to 90 min;

FIG. 19 illustrates the layer-by-layer deposition of one bilayer of a CNT-PE thin film using a self-assembly process;

FIG. 20 is an SEM image of (SWNT-PSS/PVA)$_{50}$ thin film, indicating adequately dispersed SWNTs deposited on the LbL thin film;

FIG. 21 is an SEM image of a (SWNT-PSS/PVA)$_{50}$ LbL thin film showing the selective deposition of individual and small bundles of nanotubes within the polymer matrix, wherein rinsing during layer-by-layer self-assembly removes excessively large agglomerated particles and the inset depicts the corresponding free-standing (SWNT-PSS/PVA)$_{50}$ thin film upon lift-off from its original glass substrate;

FIG. 22A is an illustration of boundary electrode placement for conductivity mapping;

FIG. 22B is an LbL thin film specimen with boundary electrodes installed being mounted to a wood stand to prevent detachment of copper wire from the thin film electrode;

FIGS. 23A-F is a series of pattern conductivity maps ($\sigma_{pattern}$) of three types of physically etched thin film specimens, wherein 23A, 23C, and 23E are optical pictures of thin films with double slashes, straight line and L shaped etchings and 23B, 23D, and 23F are the corresponding pattern conductivity maps of 23A, 23C, and 23E with the color scale in units of S/cm;

FIG. 24A is a series of illustrating showing the sequential deposition and etching process to structure three regions of different conductivity in a single thin film;

FIG. 24B is a back-lighted image of thin film specimen with 3 dipping layers—25 (left center), 50 (right center) and 100 layers (outer field);

FIG. 24C is a conductivity map of FIG. 24B;

FIG. 25A is a thin film specimen being equally meshed into 16 individual elements by physical slicing of the thin film;

FIG. 25B is a mesh number map corresponding to FIG. 25A;

FIG. 25C is a conductivity comparison of FIG. 25A between EIT and the two-probe method (average error is 2.1%);

FIG. 26A is a (SWNT-PSS/PANI)$_{100}$ thin film under several magnitudes of pH stimuli;

FIG. 26B is an illustration of the change in spatial conductivity when pH in well A, B, C, D and E is 7, 7.5, 8, 8.5 and 9, respectively;

FIG. 26C is an illustration of the change in spatial conductivity when pH in well A, B, C, D and E is 7, 6.5, 6, 5.5 and 5, respectively; and FIG. 27 is a graph illustrating the sensitivity of three different (SWNT-PSS/PANI)$_n$ thin films under pH stimuli, wherein all three films exhibit similar linear variations in conductivity as a result of pH buffer solutions applied to the film surface.

DETAILED DESCRIPTION

1. General Matters

Example embodiments will now be described more fully with reference to the accompanying drawings. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

2. Electrical Impedance Tomography

2.1 Forward Problem: Background and Theoretical Foundations

Given any two- (2D) or three-dimensional (3D) linear isotropic medium ($\Omega$) described by a time-invariant conductivity distribution ($\sigma$), Faraday's Law of Induction states, $$\nabla \times E - \frac{\partial}{\partial t} B \tag{1}$$

and Ampere's Law states:

$$\nabla \times H = \sigma E + J^s \tag{2}$$

where E is the electric field, H is the magnetic field strength, B is the magnetic field (B=$\mu_0$H), $\mu_0$ is the magnetic permeability, and Js is the current density of current sources within the body $\Omega$. By neglecting the magnetic field when using static or low-frequency currents, Equations 1 and 2 can be combined to yield Equation 3, which is termed the Laplace Equation. This equation is widely used to model the flow of electrical current and the development of electrical potential within conductors and semiconductors:

$$\nabla \cdot (\sigma \nabla \phi) = I \tag{3}$$

Here, it is assumed that current I is neither supplied nor generated within $\Omega$ and hence, the right hand side of the Laplace equation is set to zero. The flow of current within the body is therefore due to current supplied at the boundary of $\Omega$. For a two-dimensional body (e.g., idealized thin film materials) with direct current (DC) applied to the body's boundary, Equation 3 can be rewritten as the 2D Laplace equation (Equation 4) to describe current flow at every location within $\Omega$ (based on a two-dimensional (x, y) Cartesian coordinate system).

$$\nabla \cdot [\sigma(x,y) \nabla \phi(x,y)] = 0 \tag{4}$$

Similarly, if an alternating current (AC) of cyclic frequency $\omega$ is applied to the medium, then the 2D Laplace equation is expressed as:

$$\nabla \cdot [\gamma(x,y,\omega) \nabla \phi(x,y,\omega)] = 0 \tag{5}$$

where the conductivity ($\sigma$) of $\Omega$ is replaced with the complex admittance, $\gamma$, to account for the body's conductivity, AC signal frequency, and material permittivity ($\epsilon$) as shown in Equation 6.

$$\gamma = \sigma + i\omega\epsilon \tag{6}$$

However, it is generally assumed that the applied electric signal's frequency is sufficiently low, such that $\omega\epsilon$ is infinitesimally small and $\gamma = \sigma$. In that case, Equation 4 is generally adopted in EIT formulation. From a continuum model's perspective, it is assumed that there are no discrete electrodes and that the applied current is defined as a continuous function along the body boundary, $\partial\Omega$. Regardless, if the potential of the boundary ($\phi$) can be measured, the Dirichlet boundary condition states that $$\phi(x,y) = v(x,y) \text{ at } \partial\Omega \tag{7}$$

where v is the measured boundary voltage (or potential) drop. In addition, if the sum of input and output current, I, along the entire medium's boundary is zero (i.e., if the line integral of current along $\partial\Omega$ is zero), then Neumann's boundary condition is satisfied as shown in Equation 8.

$$\phi I(\omega) \partial\Omega = 0$$

Herein, the combination of the 2D Laplace equation (Equation 4) and Dirichlet-Neumann boundary conditions (Equations 7 and 8) is referred to as the forward problem for the EIT continuum model. The forward problem guarantees that the boundary potential (v) can be determined theoretically via a known and continuous boundary current function applied to a body's boundary, I|∂Ω, where the body is characterized by a conductivity distribution function, σ(x, y).

2.2 Finite Element Method (FEM) Formulation

Often, the EIT forward problem cannot be solved in the continuum domain since a continuum spatial conductivity distribution function and an applied boundary current function are practically unobtainable. Furthermore, the solution to the continuum 2D Laplace equation is mathematically rigorous and at times implausible. As a result, a discretized weak form solution to the forward problem (Section 2.1) can be obtained using variational mechanics and techniques such as the finite element method (FEM). Here, FEM discrete elements of constant properties (e.g., conductivity) are employed to approximate the continuous 2D conductivity distribution function (σ). Similarly, as opposed to relying on a continuous boundary current function which is also practically unobtainable, the complete electrode model, which discretizes the boundary into a finite number of electrodes (L), is implemented for finite element analyses.

For the FEM formulation employed in this study, n triangular elements with second-order parabolic basis functions, wi, are employed. The potential along the boundary of each element ($\phi/\partial\Omega E$) can then be obtained by taking the sum of the three nodal (i.e., the vertices of the triangular element) potentials of each ith element multiplied by each of its corresponding basis functions as shown in Equation 9.

$$\phi/_{\partial\Omega E} = \Sigma_{i=1}^{3} \phi_i w_i \quad (9)$$

Since the basis functions are not differentiable at the ith node, the weak formulation of the Laplace equation is derived using variational methods:

$$\int_V V[\nabla \cdot (\sigma \nabla \phi)] dV = 0 \quad (10)$$

where V is an arbitrary function and Equation 10 is integrated over the body Ω. The combination of the weak form of the Laplace equation (Equation 10), the discretization of potential (Equation 9), and the Dirichlet-Neumann boundary conditions, results in a linear set of equations. In matrix format, the global set of linear equations is rewritten as:

$$\begin{bmatrix} A_M + A_Z & A_W \\ A_W^T & A_D \end{bmatrix} \begin{bmatrix} \Phi \\ V \end{bmatrix} = \begin{bmatrix} 0 \\ I \end{bmatrix} \quad (11)$$

where $\Phi=(\phi 1, \ldots, \phi n)^T$ is a vector that includes all elemental nodal potentials, $V=(v1, v2, \ldots, vp)^T$ is a vector that contains all measured boundary electrode voltages, and A is a square matrix calculated from the second-order basis functions (w) and element conductivities (σ). Thus, Equation 11 provides the foundation for determining the measured boundary voltage V due to the application of a known boundary current, I, to the numerically meshed body. The reader is referred to Hou, et al. for a more detailed discussion regarding the implementation of triangular elements and the finite element method for electrical impedance tomography of thin film composites.

2.3 Inverse Problem: Electrical Impedance Tomographic Conductivity Mapping

Figure 1:
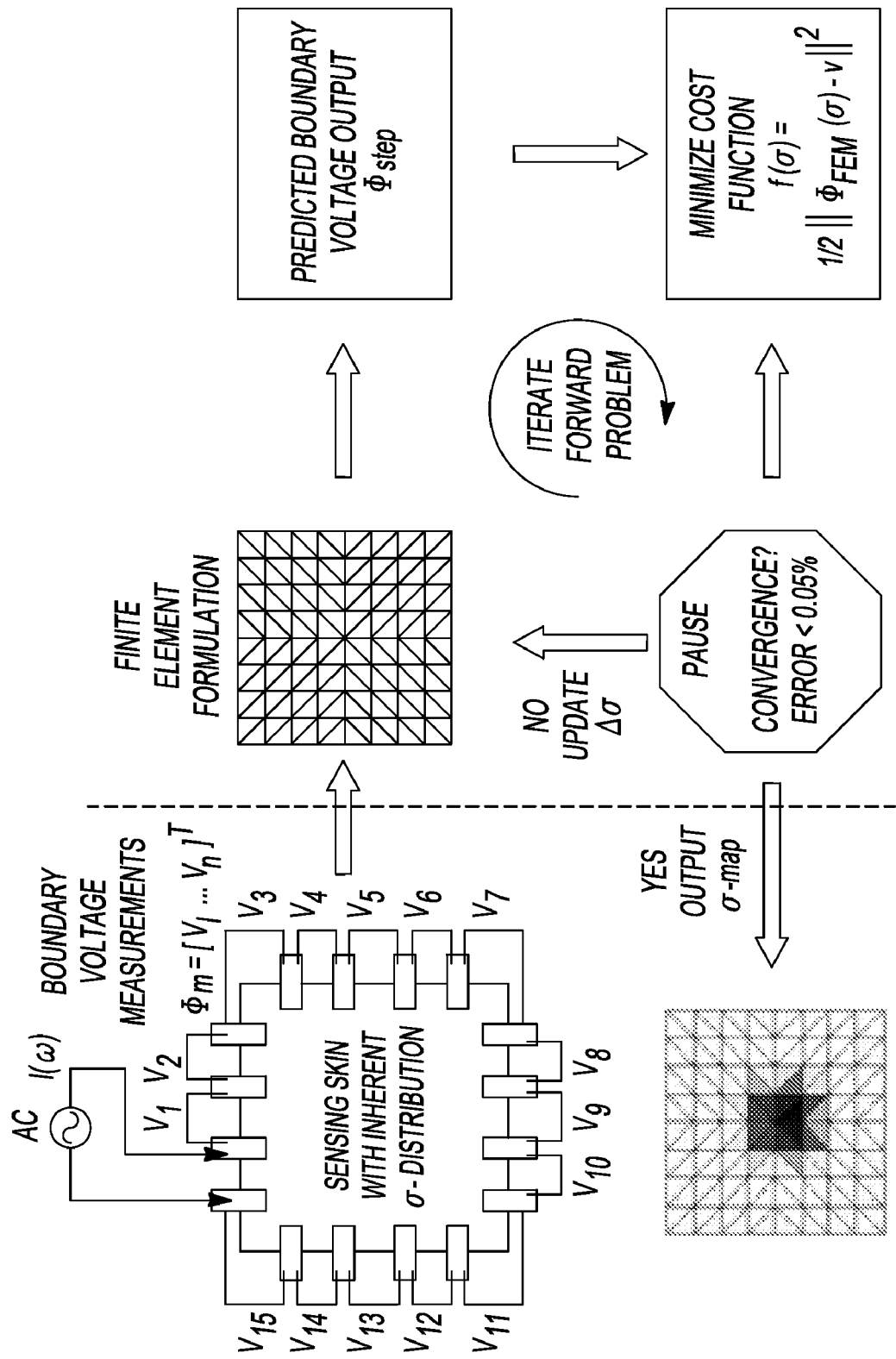

In short, electrical impedance tomography relies on a complete set of simultaneous current injection and voltage measurements along a body's boundary (i.e., at its electrodes) to reconstruct its spatial conductivity distribution (herein termed the inverse problem and illustrated in FIG. 1). By its nature, the aforementioned inverse problem is ill-posed such that a unique solution may not exist for a given data set. Therefore, current is injected on all possible sets of adjacent electrodes, with voltage measurements taken so as to create an over-determined data set. The inverse problem then seeks to determine the optimal spatial conductivity distribution by minimizing the difference between predicted boundary electrode potentials (as calculated by an assumed σ distribution based on the FEM model) with actual experimental boundary voltage measurements, V. More specifically, each step of the iterative inverse problem updates each FEM element's conductivity and solves the forward problem to determine the set of predicted boundary potentials. The predicted boundary potentials are compared to experimental boundary voltage measurements, and the EIT forward problem seeks to minimize a quadratic least-squares objective function such as Equation 12.

$$f(\sigma) = \frac{1}{2} \|\phi(\sigma)|_{\partial\Omega} - v\|^2 \quad (12)$$

Here, to solve the EIT spatial conductivity reconstruction, a regularized Gauss-Newton algorithm is employed to minimize a similar but augmented least-square functional that takes into account regularization. The iterative algorithm is executed until the difference between the predicted boundary potential, $\phi(\sigma)$, and experimental boundary voltage measurements are within an acceptable error threshold (i.e., when $f(\sigma) \leq 0.05\%$). Upon convergence of the iterative Gauss-Newton inverse problem (i.e., when the error threshold criterion is met), the final conductivity map is derived. Unlike techniques such as back projection which only provide relative spatial conductivity changes between successive EIT boundary electrical measurements, this algorithm reconstructs the absolute film conductivity and has been verified experimentally by Hou, et al. In fact, the estimated FEM discrete element conductivities have been compared to experimental two- and four-point probe surface conductivity measurements to verify a maximum error bound of 2.1%. The small experimental error obtained suggests that most of the conductivity variations resulting from EIT spatial conductivity mapping can be attributed towards contact impedance uncertainties and measurement error during surface probing.

3. Experimental Details 3.1 Experimental Materials

Single-walled carbon nanotubes (HiPCO) are purchased from Carbon Nanotechnologies, Inc. Polyelectrolyte species such as poly(sodium 4-styrene sulfonate) (PSS, Mw≈1,000, 000) and poly(vinyl alcohol) (PVA) are obtained from Sigma-Aldrich. To ensure repeatability between fabricated specimens, all solutions have been made with Milli-Q 18 MΩ deionized water. All remaining chemical reagents and supplies (e.g., glass microscope slides) are from Fisher-Scientific. Metallic plate elements such as aluminum 6061-T6 alloy and carbon steel are purchased from ALRO Metals Plus, Inc. (Ann Arbor, Mich.). Finally, colloidal silver paste and copper tape used for EIT boundary electrodes are from Ted Pella, Inc.

3.2 Layer-by-Layer Sensing Skin Fabrication

According to the principles of the present teachings, a layer-by-layer self-assembly technique is employed for fabrication of the proposed sensing skin. The LbL technique is simple, low cost, and versatile, capable of incorporating a wide variety of nanomaterials and polyelectrolyte species for the design of next-generation multifunctional nanocomposites. Mechanically, nanocomposites can be tailored with properties such as high strength, stiffness, and ductility through the embedment of single-walled carbon nanotubes within a bulk polyelectrolye matrix as have been demonstrated by Mamedov, et al. and Loh, et al.

In short, the LbL thin film fabrication process is based upon the sequential adsorption of oppositely charged polyelectrolyte and nanomaterial species to form homogeneous percolated nanostructures. According to the principles of the present teachings, two oppositely-charged solutions are used: 1) negatively-charged SWNTs dispersed in 1.0 wt. % poly (sodium 4-styrene sulfonate) and 2) positively-charged 1.0 wt. % poly(vinyl alcohol). Prior to LbL, non-covalent steric stabilization (i.e., stable solutions) of SWNTs is achieved by subjecting SWNTs in 1.0 wt. % PSS (0.80 mg-mL-1) to 180 min of ultrasonication bath treatment (135 W, 42.0 kHz) followed by 90 min of high-energy tip-sonication (3.178 mm tip, 150 W, 22.0 kHz). While a variety of surfactants and polymers such as sodium dodecyl sulfate (SDS), sodium dodecylbenzene sulfonate (NaDDBS), PSS, among others, have been shown to provide adequate nanotube suspension, high molecular weight polyelectrolyte (i.e., PSS) not only facilitates dispersion but also mechanically reinforces the final nanocomposite films.

Immediately prior to sensing skin fabrication, substrates (either glass, aluminum 6061-T6 alloy, or carbon steel) surfaces are conditioned for optimal nanocomposite deposition and experimental testing. For instance, glass microscope slides are treated with piranha solution (3:7 H2SO4:H2O2) to clean and remove surface impurities such as oil, microbes, among others. On the other hand, metallic plates are first cleaned with acetone to remove oil residue and then spray-coated with a thin uniform layer of primer to electrically isolate the sensing skins from the conductive substrates.

Figure 2A:
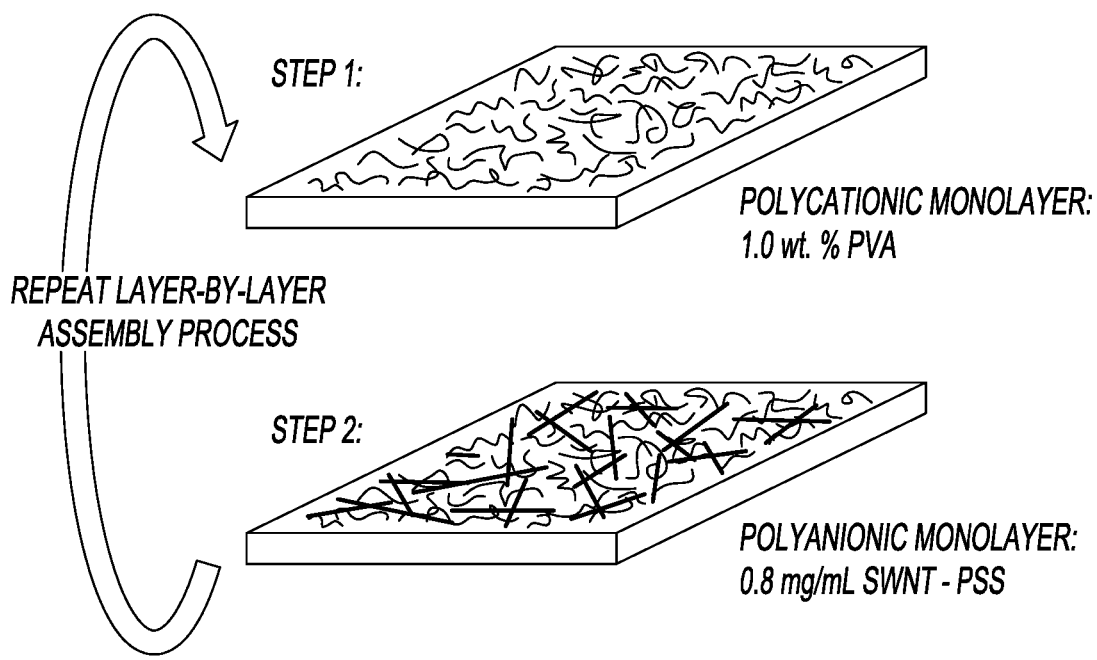
FIG. 2A is a schematic drawing illustrating the sequential deposition of polycationic (PVA) and polyanionic (SWNT-PSS) monolayers during the layer-by-layer nanocomposite fabrication process.
Figure 2B:
FIG. 2B is a photograph of a free-standing (SWNT-PSS/PVA)$_{200}$ thin film etched from its glass substrate using hydrofluoric acid.

Upon completion of substrate preparation, the LbL process begins by immersing the substrate in the polycationic 1.0 wt. % PVA solution for 5 min. The substrate is then rinsed with 18 MΩ Milli-Q deionized water for 3 min and dried with compressed air for 10 min. Then, the substrate, along with its adsorbed PVA monolayer, is dipped into the aforementioned SWNT-PSS suspension for 5 min, followed by rinsing (3 min) and drying (10 min). This process completes the adsorption of one nanocomposite bilayer and is repeated 50 or 100 times to achieve a mechanically-strong thin film sensing skin (FIG. 2). Herein, the sensing skins will be referred to as (SWNT PSS/PVA)n thin films, where SWNT-PSS and PVA represents the two oppositely-charged LbL constituents, while n denotes the number of bilayers. For a more detailed discussion on layer-by-layer self-assembly, the reader is referred to Decher and Schlenoff or previous studies conducted by Loh, et al.

Homogeneous multiphase carbon nanotube-polyelectrolyte composite thin films are fabricated via a systematic layer-by-layer assembly technique. The LbL method entails the sequential dipping of a charged substrate (i.e. glass, silicon, among others) in oppositely charged polyanion and polycation solutions to deposit a variety of species one monolayer at a time (as depicted in FIG. 19). Selective deposition of each additional monolayer is based on opposite charge electrostatic and van der Waals force interactions. By controlling fabrication parameters, such as PE, concentration of dipping solutions, and dipping time, thin films of variable compositions can be achieved.

The first monolayer in the LbL assembly process is deposited by dipping a clean, charged glass microscope slide in a positively charged polycation solution (in this case, a PE solution such as poly(vinyl alcohol) (PVA, Sigma) or polyaniline (PANI, Aldrich)) for 5 min. Excessively large particulates and loosely adsorbed PE species are rinsed off in 18 M deionized water for 3 min, followed by a drying step for 15 min to prevent cross-contamination between the oppositely charged solutions. Using very fast magic-angle spinning nuclear magnetic resonance (MAS NMR), Rodriguez et al has verified that the adsorbed polyelectrolytes remain deposited even after rinsing. The CNT monolayer deposition is achieved by dipping the PE-coated substrate in a stable, negatively charged polyanionic CNT dispersion (CNTs from Carbon Nanotechnologies, Inc.) for 5 min, followed by the rinsing/drying steps described above. Here, a 1.0 wt % aqueous solution of poly(sodium 4-styrene-sulfonate) (PSS, 1000 000 Mw, Aldrich) is employed to achieve a stable, negatively charged suspension of CNTs. This process completes one full cycle of the LbL assembly to form one bilayer of the CNT-PE thin film. Multilayer thin-film assembly is realized by repeating the aforementioned procedure to fabricate free-standing films of 50 and 100 bilayers of different compositions (table 1).

TABLE I

Matrix of 20 unique films fabricated.

|  |  | 0.25 mg ml$^{-1}$ SWNT | 0.50 mg ml$^{-1}$ SWNT | 0.80 mg ml$^{-1}$ SWNT |
|---|---|---|---|---|
| Strain sensing | $u$-SWNT-PSS/PVA$^a$ | 50 and 100 bilayers | 50 and 100 bilayers | 50 and 100 bilayers |
|  | $p$-SWNT-PSS/PVA$^b$ | 50 and 100 bilayers | 50 and 100 bilayers | 50 and 100 bilayers |
|  | $p$-DWNT-PSS/PVA$^c$ | 50 and 100 bilayers | 50 and 100 bilayers | 50 and 100 bilayers |
| pH sensing | $p$-SWNT-PSS/PANI$^d$ | — | — | 50 and 100 bilayers |

$^a$Unpurified SWNTs dispersed in 1.0 wt % wt PSS with 1.0 wt % PVA LbL counterpart.
$^b$Purified SWNTs dispersed in 1.0 wt % PSS with 1.0 wt % PVA LbL counterpart.
$^c$Purified DWNTs dispersed in 1.0 wt % PSS with 1.0 wt % PVA LbL counterpart.
$^d$Purified SWNTs dispersed in 1.0 wt % PSS with 1.0 wt % PANI LbL counterpart.

According to the principles of the present teachings, an n-bilayer composite thin film fabricated with oppositely charged species X and Y will be denoted as (X/Y)n. Specifically, three different CNTs are used (unpurified SWNTs (u-SWNTs), purified SWNTs (p-SWNTs), and purified DWNTs (p-DWNTs)). Also, two different PE species, PVA and PANI, are employed in the thinfilm composites for strain and corrosion sensing, respectively.

In order to fully harness the impressive electrical properties of CNTs and to transfer these properties to tangible length scales (i.e. LbL thin films), a stable suspension and dispersion of CNTs in an aqueous solution is necessary. Currently, many researchers have undertaken covalent stabilization techniques to molecularly bind specific species to CNT surfaces for enhanced dispersion and functionality; however, a noncovalent approach via steric stabilization of CNTs in polyelectrolyte solutions is selected for this study as this method preserves the mechanical and electrical properties of individual nanotubes. A high-molecular-weight poly(sodium 4-styrene-sulfonate) (Mw ? 1 000 000) polyanion solution is employed to facilitate dispersion of single- and double-walled carbon nanotubes. Dispersion is achieved through 180 min in an ultrasonication bath (135 W, 42 kHz) followed by 90 min of high-powered probe sonication (3.178 mm tip, 500 W, 22.0 kHz). Adequate dispersion of CNTs is verified with scanning electron microscopy (SEM), where FIG. 20 shows deposition of only individual and small nanotube bundles with the percolation threshold exceeded. While it has been found in preliminary studies that PSS facilitates dispersion of SWNTs, Moore et al validate a wide variety of polymer dispersive agents for CNTs. A key finding they report is that higher-molecular-weight polymers (e.g. PSS) tend to suspend more SWNTs due to their longer polymeric chains and the size of their hydrophilic groups for enhanced steric stabilization. Nevertheless, a wide variety of polymers and surfactants has been shown to provide adequate dispersion of nanotubes in solution. Preliminary UV-vis studies of CNT-PE thin films fabricated with PSS and PVA indicate greater absorbance than films fabricated with other polyelectrolytes (namely PDMA, PAH, among others). Measured UV-vis absorbance correlates to the amount of CNT deposition, thereby suggesting efficient nanotube deposition per LbL fabrication cycle when using PVA as the LbL electrolyte counterpart to PSS.

3.3 EIT Electrode Preparation and Data Collection

Figure 3:
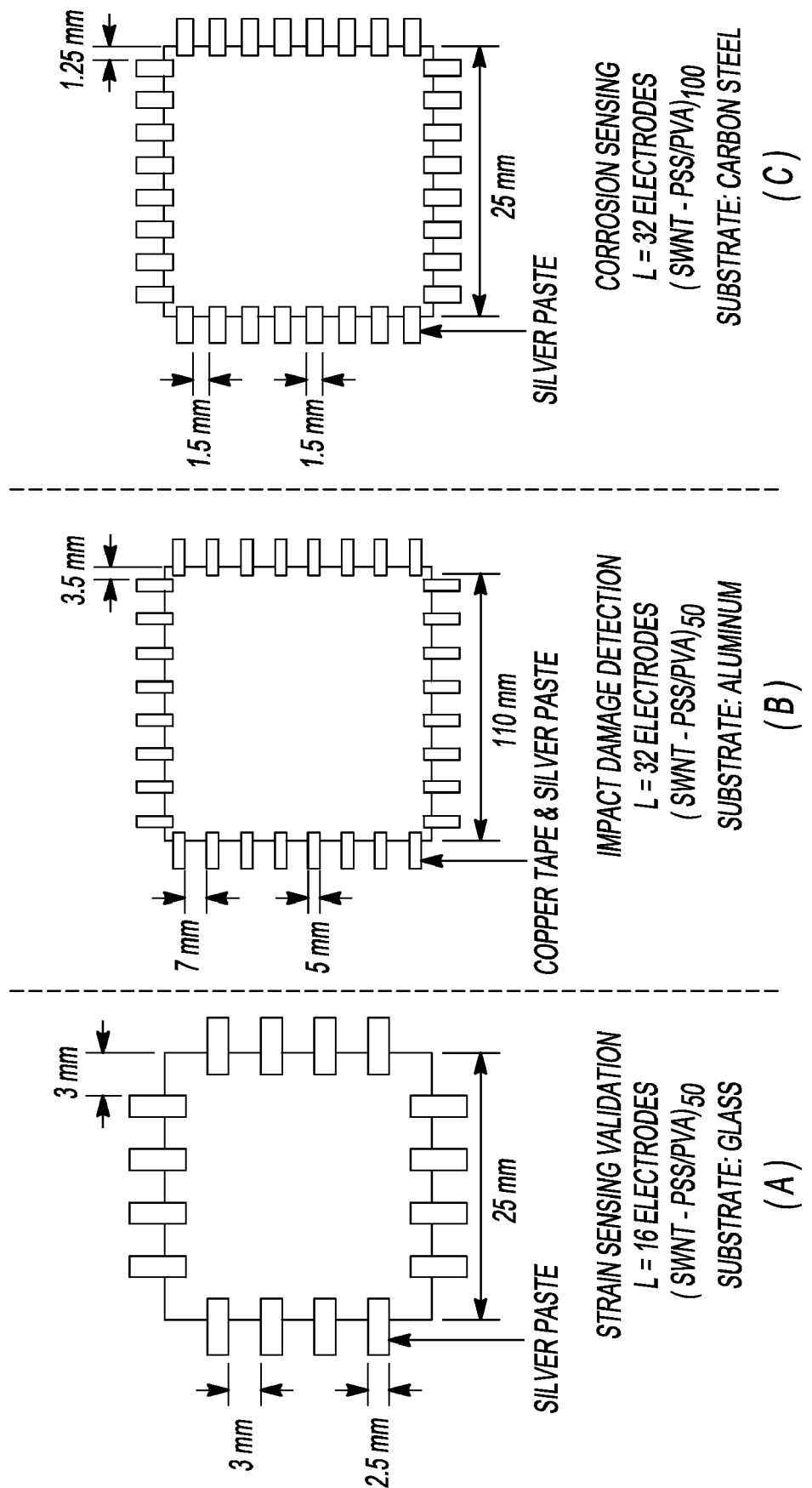

As opposed to two- or four-point surface conductivity measurements, electrical impedance tomography relies on a series of boundary electrical measurements for reconstructing the 2D or even 3D spatial conductivity image of any body, $\Omega$ (as described in Section 2). Prior to data collection, sensing skins are instrumented with 16 or 32 electrodes around their boundaries (with equal number of electrodes equidistantly spaced along each boundary of the square/rectangular sensing skin specimens as shown in FIG. 3). For skins deposited on glass substrates for resolution analysis (Section 3.4), strain sensing validation (Section 3.5), and those deposited on primer-coated carbon steel for corrosion detection (Section 3.7), accurate and precise electrode placement is ensured by using header pins with a fixed spacing. Colloidal silver paste is used to electrically connect the header pins to the nanocomposite surface. On the other hand, electrodes for impact damage identification (Section 3.6) are established using 32 copper tape electrodes; minimization of contact impedance is accomplished by drying colloidal silver paste between the copper tape and nanocomposite skin. The colloidal silver paste is allowed to dry for six hours prior to any experimental validation tests.

In order to obtain the reconstructed EIT spatial conductivity image, current flow is introduced into the skin at two adjacent electrodes on the skin boundary, while voltage is measured at all remaining electrodes. According to the principles of the present teachings, the neighboring or adjacent electrode measurement technique is employed. Experimentally, a Keithley 6221 current generator is commanded to inject a regulated AC or DC current into a pair of adjacent electrodes, while a National Instruments (NI) data acquisition system (DAQ) is employed to measure the potential drop across all other adjacent electrode pairs. Using the neighboring electrode measurement technique, a total of $L(L-1)/2$ measurements are derived (where L is the number of electrodes). While this technique has been demonstrated to produce nonuniform current density within the body leading to reduced sensitivity to conductivity changes located away from the boundary, this technique is implemented for its simplicity and fast data acquisition properties. Furthermore, it will be demonstrated in Section 4 that the high damage sensitivity of the proposed nanocomposite skins are unaffected by the neighboring electrode measurement technique.

3.4 Sensing Skin Resolution Analysis

It has been shown in Equation 4 that the two-dimensional Laplace equation is capable of modeling the flow of electrical current and the development of a boundary potential via a continuum conductivity distribution function ($\sigma$). With a continuum approach to electrical impedance tomography, the sensing skin's sensitivity and resolution to damage features are governed by inherent nanocomposite sensor properties. However, for practical applications, the EIT conductivity mapping approach employed herein relies on a discretized weak form solution using the finite element method (Section 2). Solution to the discretized EIT inverse problem yields a computed conductivity map comprised of a set of finite elements, where each element is described by an average conductivity representation of real space. In particular, the number of boundary electrodes directly determines the number of finite elements. Thus, the sensing skin's damage detection resolution and sensitivity are no longer determined by the skin's material and sensor properties, but rather, by the ratio of number of boundary electrodes to specimen size.

Thus, to investigate the damage detection limits of electrical impedance tomographic conductivity mapping of sensing skins, a $(SWNT-PSS/PVA)_{50}$ skin is fabricated onto a 25×25 mm² glass substrate. Three regions of zero conductivity are created by mechanically etching the nanocomposite to form three rectangular windows of size: i) 1×1 mm2, ii) 2.5×2.5 mm², and iii) 8×6 mm² (width×height) as illustrated in FIG. 4. Using header pins, eight 1.5 mm boundary electrodes are mounted onto each side of the nanocomposite boundary. Colloidal silver paste is employed to electrically connect the header pins to the nanocomposite surface as discussed in Section 3.3. The 8×8 electrode configuration results to 512 isosceles triangular finite elements (with an edge size of 1.5 mm). EIT spatial conductivity mapping is then executed, and the resulting EIT image is compared with photographs of the etched specimen.

3.5 Sensing Skin Strain Sensing Validation

To demonstrate that these 2D sensing skins capture changes in film conductivity (i.e., the inverse of resistivity) with applied strain, $(SWNT-PSS/PVA)_{50}$ skins deposited onto 25×25 mm² glass substrates are affixed onto PVC (polyvinyl chloride) Type I tensile coupons (31 cm long, 4 cm wide, 2 cm thick) via CN-Y post-yield epoxy (Tokyo Sokki Kenkyujo). Upon sufficient drying of the epoxy (6 hours), eight header pins are also epoxy-mounted to each of the four sides of the square skin (FIG. 3*a*). Colloidal silver paste is dried between adjacent pairs of header pins to form equidistantly-spaced equal-size EIT boundary electrodes. Finally, each $(SWNT-PSS/PVA)_{50}$ sensing skin (on glass), along with the PVC coupon, is mounted in an MTS-810 load frame where it is programmed to execute a tensile-compressive cyclic load pattern to ±2,000 or ±5,000µε at a fixed load rate of 50µε/s so as to prevent cracking of the glass substrate (FIG. 5). The load frame is paused at 1,000µε or 2,500µε intervals while the EIT DAQ is commanded to inject current and measure boundary electrode potentials as described in Section 3.3.

3.6 Distributed Impact Damage Detection

As mentioned in Section 3.3, $(SWNT-PSS/PVA)_{50}$ deposited on 110×110 mm2 primer-coated aluminum 6061-T6 alloys are used for impact-damage detection validation tests (FIG. 3b). In order to induce controlled-energy impacts on various locations on the large substrate, a pendulum impact testing apparatus is constructed in the laboratory. The pendulum test structure consists of an adjustable swinging arm (variable between 20 to 30 cm), a sharp aluminum tip (termed the striker), and a rod connected to the striker to hang washers for controlling the pendulum mass as shown in FIG. 6. In addition, the test apparatus is configured such that the pendulum arm can be rotated between 0° and 180° to control the magnitude of the initial potential energy that is converted to the final impact-deformation strain energy (where 0° corresponds to the situation when the tip of the striker is in contact with the skin specimen).

Each skin-coated aluminum alloy specimen is mounted with fixed-fixed boundary conditions on the testing apparatus. Two sturdy plexiglass windows are securely mounted to the pendulum structure and a total of six C-clamps are used to secure plate specimens between the two windows. In this series of tests, the pendulum is adjusted to impact two plate specimens at various locations with different initial potential energies (i.e., the striker mounted on the pendulum is released at different initial angles and arm lengths). In order to demonstrate sensing skins' ability to capture the location of damage and severity of impact (i.e., the amount of strain energy absorbed for plate deformation) across large structural surfaces, four impacts are induced per specimen. Finally, EIT conductivity mapping is performed to identify damage.

3.7 Accelerated Corrosion of Steel

Following skin fabrication and electrode preparation details provided in Section 3.3, accelerated corrosion testing is conducted by exposing 25×25 mm2 carbon steel substrates to different concentrations of sodium chloride (0.1 M and 1.0 M NaCl) solutions. In efforts to control the region of accelerated corrosion and corrosion byproduct (i.e., iron oxide or rust) formation, two 7 mm circular regions of exposed steel are formed by mechanically etching away the sensing skin and primer coatings. Then, two 7 mm diameter plastic wells are securely mounted over the exposed circular holes using high-vacuum grease (Dow Corning); these plastic wells are used to contain salt solutions to selectively facilitate corrosion at etched circular regions (FIG. 7). Instead of exposing the entire substrate to concentrated NaCl solutions which can potentially corrode boundary electrodes and alter electrode contact impedance, the technique used in this study confines solution exposure and corrosion regions. Furthermore, to demonstrate the sensing skin's ability to detect progressive corrosion byproduct formation, the salt solutions are pipetted out of each well after 5 min of exposure time. Then, the specimens are allowed sufficient time to dry (3 hrs) prior to EIT spatial conductivity imaging. The aforementioned steps are repeated for a total corrosion time (i.e., NaCl solution exposure time) of 90 min.

4. Experimental Results & Discussion

4.1 Sensing Skin Resolution Analysis

As detailed in Section 3.4, a (SWNT-PSS/PVA)$_{50}$ nanocomposite is deposited onto a glass substrate and mounted with 32 boundary electrodes (FIG. 8a), and an initial EIT spatial conductivity map is obtained to serve as the baseline. Upon mechanical etching to remove the thin film at three distinct rectangular regions, EIT is executed again to compute the relative spatial conductivity change (FIG. 8b). From FIG. 8b, it can be clearly observed that the sensing skin successfully identifies three distinct rectangular regions (i.e., (i), (ii), and (iii) corresponding to FIG. 4) with a significant drop in conductivity due to the removal of the nanocomposite skin. While the sensing skin is capable of accurately identifying the size and location of etched regions (ii) and (iii), it can be seen from FIG. 8b that the magnitude of conductivity change near etched window (i) is smaller than regions (ii) and (iii). Since each EIT boundary electrode and electrode spacing are both 1.5 mm wide, the size of this damage feature (region (i) is 1×1 mm2), is smaller than or equal to a pair of triangular finite elements within the reconstructed EIT spatial conductivity map. As a result, damage feature (i) represents the detection limit or resolution of the sensing skin. It is anticipated that the sensing skin is insensitive to damage features smaller than the size of one finite element of the reconstructed EIT image.

In order to provide a more quantitative analysis of the sensing skin's accuracy to identify damage location, at each area where the nanocomposite skin has been etched, the photograph (FIG. 8a) and EIT spatial conductivity map (FIG. 8b) of the skin is assembled into normalized n-by-m matrices [P] and [C], respectively. In this case, [P] is a binary representation of the actual specimen photo; Pxy is 1 at locations where the nanocomposite is intact, and Pxy is 0 where the thin film is mechanically etched. On the other hand, each element of the conductivity map matrix [C] is scaled between 0 and 1 to represent the computed sensing skin conductivity (where zero corresponds to the non-conductive case, and unity represents maximum electrical conductivity). Thus, the correlation between the computed EIT conductivity map and specimen is obtained by computing the least-squares error matrix ([E]) between each pair of corresponding pixels as shown in Equation 13:

$$\begin{bmatrix} E_{11} & \cdots & E_{1m} \\ \vdots & \ddots & \vdots \\ E_{n1} & \cdots & E_{nm} \end{bmatrix} = \begin{bmatrix} 1 - \sqrt{(P_{11} - C_{11})^2} & \cdots & 1 - \sqrt{(P_{1m} - C_{1m})^2} \\ \vdots & \ddots & \vdots \\ 1 - \sqrt{(P_{n1} - C_{n1})^2} & \cdots & 1 - \sqrt{(P_{nm} - C_{nm})^2} \end{bmatrix} \quad (13)$$

By definition, each element of [E] also spans between 0 and 1, such that maximum correlation is obtained when Exy is 1 (and Exy is 0 when there is no correlation).

The least-squares error matrix at each area where the sensing skin has been etched is computed and plotted together in FIG. 9 to illustrate the degree of correlation between the EIT conductivity map and specimen. From FIG. 9, it can be seen that the sensing skin is capable of accurately identifying the location, size, and geometry of different etched regions. Evaluation of correlation is achieved by computing the average least-squares error of each etched region's error matrix, [E]i, where Eavg,(i)=0.69, Eavg,(ii)=0.76, and Eavg,(iii)=0.82 (corresponding to regions (i), (ii), and (iii) respectively). The computed average correlation suggests that, as the etched feature size decreases from region (iii) to region (i), the degree of correlation also decreases (as also evident in FIG. 9). At the limit where etched feature (i) is only 1×1 mm2, it can be seen from FIG. 9 that the correlation obtained is only average. The lack of correlation obtained at etched region (i) is expected since each EIT boundary electrode is 1.5 mm wide and is larger than this particular damage feature. Thus, results from this analysis show that the sensing skin resolution is limited by EIT boundary electrode dimensions. Nevertheless, for spatial conductivity changes larger than each EIT boundary electrode, the sensing skin can accurately identify damage.

4.2 Time-Invariant EIT Conductivity Mapping

Previous studies conducted by Loh, et al. have validated (SWNT-PSS/PVA)n films' change in electrical properties to applied strain. In general, nanocomposite electrical properties respond linearly to applied strain, where film resistivity ($p=1/\sigma$) is proportional to strain and has been modeled accurately using a parallel resistor-capacitor (RC) circuit. The typical strain sensitivity (SS) is estimated to be approximately 2.0, comparable to those of traditional metal-foil strain gages and is calculated using Equation 14 (in terms of conductivity), $$S_S = (\Delta\sigma/\sigma_0)/\epsilon \qquad (14)$$

where $\Delta\sigma$ is the conductivity change due to applied strain $\epsilon$, and $\sigma 0$ is the nominal (i.e., no strain) conductivity of the sensing film. However, it has been determined that these LbL nanocomposites exhibit an undesirable exponential decrease in nominal film resistivity (RO) over time (~10 hrs). Nevertheless, the application of electrical impedance tomographic spatial conductivity imaging avoids having to account for the nanocomposite's time-variant nominal conductivity (or its inverse, resistivity). Results obtained from a study conducted by Loh, et al. have demonstrated that the resistivity decay rate is proportional to applied current (for measuring film conductivity or resistivity), where a larger current input increases the decay rate. In addition, upon removal of the applied current source, the nominal conductivity of the film recovers to its initial pristine state. Thus, applied AC or DC current waveforms injected into two adjacent electrodes for EIT spatial conductivity mapping are limited in amplitude (~0.1 mA) and duration (~1 ms). In fact, experimental results have validated the time-invariant conductivity maps generated by repeated EIT reconstruction.

4.3 Linear Strain Sensing Validation

Figure 10:
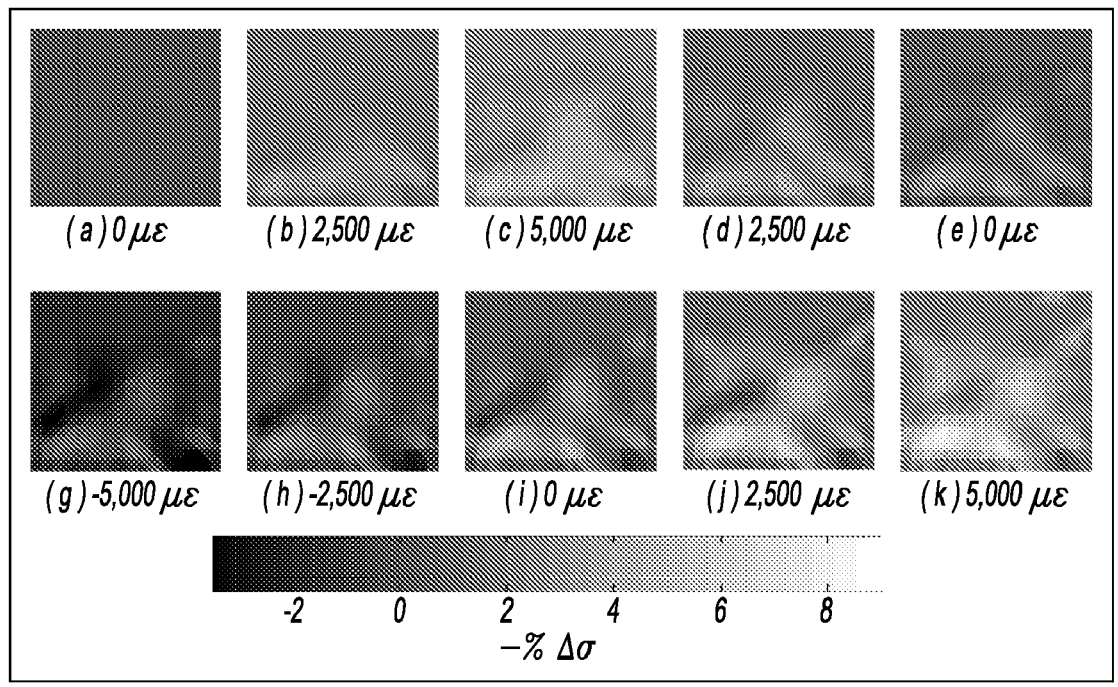

To demonstrate that EIT-reconstructed spatial conductivity images also exhibit linear changes in average conductivity with applied strain, sensing skin specimens are epoxy mounted to PVC Type I bars and mechanically loaded in a one-cycle tensile-compressive load pattern to ±2,000 and ±5,000µε (Section 3.5). FIG. 10 plots the set of sequential EIT spatial conductivity maps of an (SWNT-PSS/PVA)$_{50}$ thin film strained at 2,500µε intervals during the application of a one-cycle tensile-compressive load pattern to ±5,000µε. From FIG. 10, it can be clearly identified that the overall change in skin conductivity varies inversely with applied strain (i.e., the negative change in conductivity changes in tandem with increasingly applied strain). In addition, the spatial conductivity maps obtained at every 2,500µε interval suggests non-uniform deformation and conductivity change with applied strain. From FIGS. 10c, 10g, and 10k (peak tensile and compressive applied strains), it can be observed that the non-uniform changes in conductivity distribution are more pronounced than cases when zero strain is applied to the specimen (FIGS. 10a, 10e, and 10i).

However, to evaluate the skin's strain sensing performance (i.e., linearity and sensitivity), the average change in conductivity corresponding to all elements of the EIT conductivity map is computed and compared to the applied load pattern as shown in FIG. 11a. It can be seen from FIG. 11a that the negative change in average EIT skin conductivities are directly proportional to applied strain. In addition, the results obtained validate the sensing skin's ability to capture both tensile and compressive strains. By plotting the negative change in conductivity as a function of applied strain, it can be seen from FIG. 11b that the proposed sensing skins exhibit linear strain sensing response. In addition, results shown in FIG. 11a confirm that the sensing skin approach eliminates the time-variant nominal conductivity drift observed in previous studies. Furthermore, the slope of the least-squares fitted line for all specimens tested is computed to quantify the strain sensor sensitivity (Equation 14). The computed strain sensitivities (SS) presented in FIG. 11b range from 3.2 to 6.5, thereby suggesting higher sensitivity than traditional metal-foil strain gauges (SS≈2). The sensing skin's high strain sensitivity and high resolution are ideally suited for structural monitoring applications to detect small changes in a structure's induced strains.

4.4 Spatial Impact Damage Detection

This study is extended to detect spatially-distributed impact damage on metallic plate elements using the proposed LbL carbon nanotube-based skins. Using the experimental setup described in Section 3.6, four different magnitudes of impact damage are introduced at various locations on each of the two plate specimens (herein referred to as IM-01 and IM-02).

TABLE II

Controlled impact damage on skin- and primer-coated aluminum plates for specimen IM-01

| Impact Number | Location (Front) | Arm Length (cm) | Pendulum Angle (°) | Impact Energy (J) |
|---|---|---|---|---|
| Impact-[i] | Top right | 24 | 20 | 0.09 |
| Impact-[ii] | Bottom left | 27.5 | 40 | 0.38 |
| Impact-[iii] | Bottom right | 27.5 | 60 | 0.81 |
| Impact-[iv] | Top left | 24 | 80 | 1.17 |

TABLE III

Controlled impact damage on skin- and primer-coated aluminum plates for specimen IM-01

| Impact Number | Location (Front) | Arm Length (cm) | Pendulum Angle (°) | Impact Energy (J) |
|---|---|---|---|---|
| First test (0 days) | | | | |
| Impact-[ii] | Middle right | 25.7 | 60 | 0.71 |
| Impact-[iii] | Bottom center | 28.5 | 90 | 1.63 |
| 2d test (14 days) | | | | |
| Impact-[i] | Top left | 23.6 | 30 | 0.19 |
| Impact-[iv] | Center | 25.4 | 180 | 3.25 |

From Tables II and III, it can be seen that the lowest applied impact energy is labeled as [i], while the highest impact energy is referred to as [iv]. Since sensing skins are deposited on both sides of the metallic plate specimens, the "back" side of the plate is where the impact striker physically contacts and impacts the skin, and the "front" side is the opposite non-contact face. Prior to any induced impact damage, boundary electrical measurements are obtained and the EIT inverse problem is solved to reconstruct the baseline undamaged conductivity distribution of the pristine plate.

Figure 12:
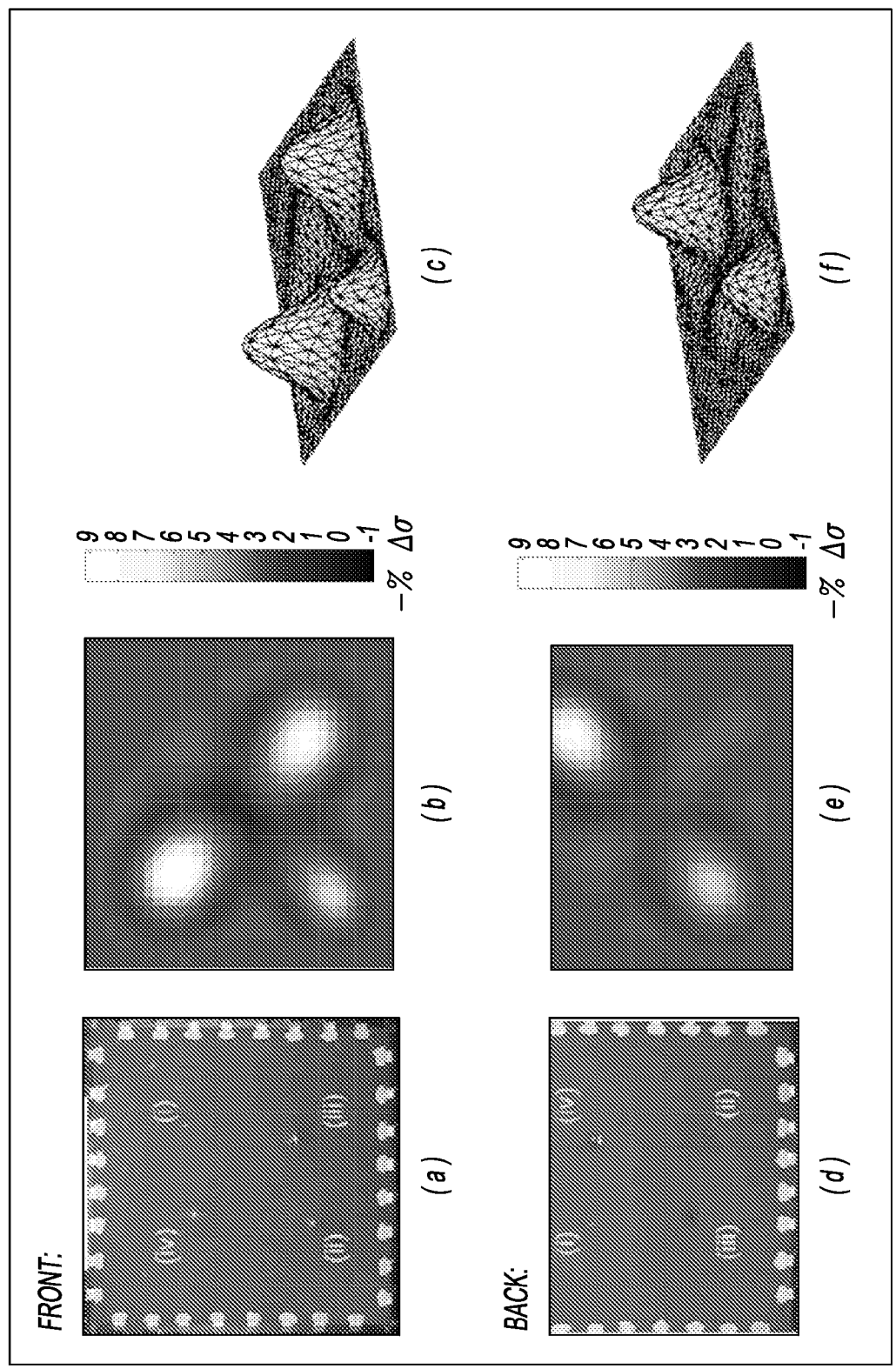

In order to evaluate the sensing skin's ability to detect both the location and severity of structural impact damage, the first plate specimen (IM-01) is mounted in the pendulum test apparatus (FIG. 6) and impacted four times (as shown in FIGS. 12a (front) and 12d (back)). Each of the four controlled impacts is conducted at different locations and have different initial impact energies (i.e., controlled by the arm length and initial pendulum angle) as listed in Table I. Once all four impact damages have occurred, EIT spatial conductivity mapping is executed to obtain a "damaged" sensing skin conductivity map. From FIGS. 12b (front) and 12e (back), it can be seen that the relative negative conductivity change for both the front and back sides clearly identify damage location and severity. From Section 4.3, it has been validated that higher levels of applied strain causes greater change in skin conductivity. With higher initial applied impact energies (e.g., damage locations [iii] and [iv]), the plate and skins undergo higher levels of deformation and strain. Thus, with greater initial impact energies (i.e., severe damage), the change in sensing skin conductivity is expected to be higher as shown in FIGS. 12b (front) and 12e (back).

It should be noted that small damage thresholds (impact locations [i] and [ii]) are hard to detect in the 2D reconstructed EIT conductivity maps; however, damage is accurately detected but is masked within the color bar to better illustrate larger induced damages (impact locations [iii] and [iv]). To better make this point, the 2D maps are plotted in 3D to facilitate damage identification (see FIGS. 12c and 12f). Upon computing the average change in skin conductivity within the vicinity of induced impact damage for the front- and back-side skins, it can be observed from FIG. 13 that small levels of damage can be detected. In addition, the change in conductivity varies near linearly with respect to initial impact energy.

For sensing skins to demonstrate potential applicability for long-term structural health monitoring, it is important to begin characterization of sensor long-term performance. For instance, structural damage typically occurs continuously throughout the service life of engineered systems. Thus, in addition to being able to detect pristine and damaged structural states, it is worthwhile to investigate the sensing skin's response to damage induced over time. Thus, upon obtaining boundary electrical measurements for specimen IM-02 to determine the initial baseline conductivity map, two additional impact tests are conducted. First, two different magnitudes of pendulum hits (damage levels [ii] and [iii] tabulated in Table II and shown in FIGS. 14a and 14d) are conducted at different locations on the aluminum alloy plate. Similarly, impact damage location and severity can be identified precisely from the 2D (FIGS. 14b and 14e) and 3D (FIGS. 14c and 14f) EIT conductivity images for the front and back sides of the plate, respectively.

Upon completion of the aforementioned test, the plate specimen is stored in ambient conditions for approximately 14 days prior to the next damage occurrence. Here, two additional controlled impacts ([i] and [iv] shown in FIGS. 15a and 15d) are conducted; the location and initial impact energies are tabulated in Table II. It should be noted that the pendulum striker penetrated the entire plate at impact-[iv] (i.e., the most severe case of damage). Then, the EIT inverse problem is executed to obtain the 2D (FIGS. 15b and 15e) and 3D (FIGS. 15c and 15f) EIT spatial conductivity images. From FIGS. 14 and 15, it can be concluded that, not only did the sensing skins capture new damage sustained on the aluminum alloy plates, but also, the EIT images also preserve damage which occurred 14 days ago. Finally, when the average conductivity at each impact location is determined and plotted against initial impact energy, the response is near-linear as expected (FIG. 16).

4.5 Spatial Corrosion Sensing

To further showcase the multi-functionality of carbon nanotube-based sensing skins for structural damage detection, sensing skins have been deposited onto carbon steel substrates for long-term electrochemical monitoring of corrosion byproduct formation (as described in Section 3.7). As before, an initial EIT spatial conductivity map is obtained to serve as the undamaged baseline. Upon acquiring successive time-lapsed EIT maps due to application of concentrated sodium chloride solutions, it can be seen from FIG. 17 that the spatial conductivity within the wells drop over time as rust begins to accumulate within the wells. It is known that corrosion of steel occur due to oxidation of iron (within steel) to form iron oxide (i.e., rust):

$$3Fe + 4H_2O \rightarrow Fe_3O_4 + 8H^+ + 8e^- \tag{15a}$$

$$2Fe + 3H_2O \rightarrow Fe_2O_3 + 6H^+ + 6e^- \tag{15b}$$

When water is available for oxidation of iron, the reaction kinetics highly favors the formation of iron oxide. As a result, with increased water exposure time, rust will continue to form as long as the chemical reaction is not rate limited by iron availability. With increased salt solution (or water) time-of-exposure, iron oxide continues to form on exposed-steel surfaces. Similarly, upon computing the average change in conductivity at Wells #1 and #2 (FIG. 7a) at every 5 min interval, the plot of average change in well conductivity as a function of time is obtained (FIG. 18). With increasing salt solution exposure time, the average conductivity change for both Wells #1 (1.0 M NaCl solution) and #2 (0.1 M NaCl solution) follow the same trend; initially, a sudden drop in conductivity is observed, followed by a decreasing rate until eventual plateauing of conductivity change when t=90 min. The plateauing effect is observed, because as the thickness of iron oxide increases, the area of bare steel is reduced to limit iron oxidation. The results obtained in FIG. 18 agree with those obtained by Yonemoto and Shida, where they have determined that their proposed corrosion sensor impedance increases in a similar fashion with increasing rust thickness.

In fact, the experimental results obtained in FIG. 18 can be easily fit to an exponential decay model of the form $-\Delta\sigma = -Ae^{-Bt} + C$ via regression analysis. Results from numerical fitting suggest that the average change in thin film conductivity due to corrosion byproduct formation is well-behaved. The nanocomposite conductivity decreases at an exponential rate of 0.031 min-1 at Well #1 (1.0 M NaCl) and 0.024 min-1 at Well #2 (0.1 M NaCl). The faster corrosion rate at Well #1 is consistent with the higher concentration of salt solution employed to accelerate corrosion. Current work is in progress to determine the underlying electrochemical sensing transduction mechanisms that take place during iron oxide formation.

4.6. Conclusions

According to the principles of the present teachings, a versatile layer-by-layer thin film assembly technique is employed for multifunctional nanocomposite fabrication. Previous studies have confirmed that these carbon nanotube-polyelectrolyte multilayer composites can be tailored with specific electromechanical and electrochemical sensing transduction mechanisms for strain and pH/corrosion monitoring. Physically, these thin films possess a highly percolated homogeneous structure, with deposition of individual or small bundles of single-walled carbon nanotubes within a compliant polymeric matrix. In addition, these nanocomposites exhibit enhanced strength, stiffness, and ductility, such that ultimate film failure occurs beyond 10,000µε.

When combined with an electrical impedance tomographical (EIT) spatial conductivity mapping technique, these "sensing skins" have been validated for distributed strain, impact, and corrosion sensing. As opposed to a densely-distributed sensor instrumentation strategy, sensing skins can be coated onto structural surfaces to monitor distributed damage processes. Furthermore, instead of probing every discrete sensor for structural response data, EIT relies solely on boundary electrical measurements to reconstruct the 2D spatial conductivity distribution. Since skin electrical properties have been calibrated for specific applied external stimuli, changes in spatial film conductivity are directly correlated to damage.

First, $(SWNT-PSS/PVA)_{50}$ films are affixed onto PVC coupons for strain sensing. A tensile-compressive cyclic load pattern to ±5,000µε is applied to specimens, and the load frame is paused at 2,500µε increments for EIT data acquisition. Results obtained confirm the skin's ability to detect non-uniform strain fields during applied strain. When the average conductivity change at each applied strain is computed, the results confirm the skin's linearity, stability, and high sensitivity (SS=6.5). It should be reiterated that this strain sensing validation is conducted with applied uniaxial stresses and strains. Since the nanocomposite morphology is based on a homogeneous percolated network of intertwined SWNTs, and that strain-induced electrical variations are consequences from nanotube rigid body movements within a compliant polymeric matrix, the proposed strain sensor only detects average strain at any given location. Similarly, changes in film conductivity does not distinguish between the directionality of strains (e.g., during biaxial loads) but rather outputs an averaged conductivity change.

On the other hand, in order to enable identification of the directionality of strain, carbon nanotubes can be aligned within the polymeric matrix such that the sensor is insensitive to deformations occurring perpendicular to the aligned axis. Using the layer-by-layer technique, two perpendicularly aligned sensing layers can be fabricated within one multilayer thin film structure. By measuring the change in conductivity of each individual aligned-SWNT layer, one can infer both the magnitude and direction of applied strain. Although work is in progress to implement the aforementioned aligned nanotube thin film, this study focuses on validating sensing skins' sensitivity to typical structural damage processes.

Upon strain sensing validation, the study is extended to utilize sensing skins for spatial impact damage detection. The LbL technique is employed to deposit carbon nanotube-based composites onto large (110×110 mm2) aluminum alloy substrates. Using a pendulum impact testing apparatus, controlled impacts are delivered onto sensing skin-coated aluminum specimens. Experimental results confirm that the skins are capable of identifying distributed impact damage location and severity. In addition, the impact damage sensing performance does not degrade over time (i.e., damage occurred over time is adequately detected via successive EIT measurements over a 14 day period), suggesting potential for long-term structural health monitoring. To further showcase the multi-functionality of these skins, concentrated sodium chloride solutions have been employed to accelerate corrosion at select circular regions on skin-coated steel substrates. Time-lapsed EIT conductivity maps taken at every 5 min interval demonstrate the effectiveness of monitoring progressive corrosion byproduct (i.e., iron oxide) formation.

In some embodiments, these skins can be placed on actual structural components to illustrate their potential for field applications. Moreover, long-term sensor stability tests will be conducted; here, skins will be exposed to ambient conditions to identify potential environmental factors that may affect sensor performance. In particular, outdoor use will be explored with skin exposed to weather conditions, ultraviolet (UV) sun light, among other factors. The layer-by-layer skin fabrication technique will also be aerosolized to facilitate efficient application onto existing structural elements such as gusset plates, steel girders, airfoils, among many other structural surfaces.

5. Spatial Conductivity Mapping

Experimental Details 5.1. Materials

Purified single-walled carbon nanotubes (SWNT) with ash content less than 13 wt % are obtained from Carbon Nanotechnologies, Inc. Thin film polyelectrolyte constituents, namely poly(aniline) emeraldine base (PANI, Mw≈100 000), poly(vinyl alcohol) (PVA) and poly(sodium styrene-4-sulfonate) (PSS, Mw≈1 000 000), are purchased from Sigma-Aldrich. The remaining reagents were obtained from Fisher-Scientific. Electrical contacts between the thin film and electrodes are established using colloidal silver paste and copper tape, both of which are purchased from Ted Pella.

5.2. Nanocomposite Fabrication Methodology

The fabrication of homogeneous nanostructured multi-functional thin films is attained via a layer-by-layer (LbL) selfassembly method. Through alternate dipping of a charged substrate (e.g. glass or silicon) in oppositely charged polyelectrolyte and suspended nanomaterial species, a thin film of controlled morphology with no phase segregation can be deposited one monolayer at a time. The alternate nanometer-thickmonolayers of polyelectrolyte and nanomaterials are held by weak interaction forces such as electrostatic and van der Waals forces. Through judicious selection of polyelectrolytic species used during LbL self-assembly, multifunctional nanocomposites have been successfully demonstrated.

According to the principles of the present teachings, LbL assembly begins by dipping a charged glass substrate treated with piranha solution (3:7 by vol H2O2:H2SO4) in a polycationic (1.0 wt % PANI dissolved in 1.0 vol % DMF or 1.0 wt % PVA in deionized water) solution for 5 min. Upon rinsing with 18 M_ deionized water for 3 min followed by drying with compressed nitrogen for 10 min, the substrate, along with its adsorbed monolayer, is then immersed in a polyanionic solution. Enhancement of thin film conductivity and pH sensitivity is accomplished via the use of a steric stabilized SWNT in 1.0 wt % PSS solution to yield a stable polyanionic suspension after ultrasonication bath (90 min) and probe sonication treatment (90 min) (as outlined herein). The LbL process continues by immersing the substrate in the prepared SWNT-PSS solution for 5 min, followed by rinsing and drying for 3 and 10 min, respectively. The aforementioned procedure yields one bilayer of the thin film and is denoted as (A/B)n, where A and B represent the oppositely charged species and n represents the number of bilayers. Realization of electrically conductive and mechanically strong sensing skins for EIT spatial conductivity mapping is accomplished by fabricating (SWNT-PSS/PANI)$_{50}$, (SWNT-PSS/PANI)$_{100}$ and (SWNT-PSS/PVA)$_{50}$ thin films (table 1). From the SEM image of FIG. 21, it can be seen that only individual and small bundles of SWNTs are deposited in the polymer matrix composite during LbL self-assembly.

5.3. Nanocomposite Thickness Measurement

In order to ensure accurate EIT calculations of thin film conductivity, the precise thickness of each specimen is measured using a J A Woollam spectroscopic ellipsometer. The entire set-up of the spectroscopic ellipsometer consists of a Base-160 sample holder with a QTH-200 light source connected to an EC-270 electronic control module and data acquisition system (DAQ). Since ellipsometry thickness measurements require thin films deposited on a reflective surface, LbL SWNT composites are fabricated onto a silicon substrate (with a 38 nm thick oxide layer, University Wafers). By taking 16 total ellipsometry thickness measurements at 16 unique locations throughout the thin film surface, the average film thickness and thickness gradient is determined.

5.4. Boundary Electrical Measurement

Spatial conductivity mapping of CNT composite thin films by EIT is achieved by measuring current-voltage relationships across a thin film's boundary. According to the principles of the present teachings, electrical potential measurement of thin films is performed using electrical contacts made by drying colloidal silver paste (□1 mm wide) equidistantly spaced (□2 mm) between strip copper header pins (DigiKey) and the film surface. For instance, SWNT multilayer thin film specimens roughly 25×25 mm2 in area are instrumented with eight electrodes along each of the four sides of the film boundary (totaling 32 electrodes). According to the principles of the present teachings, electrode placement is precise because of the use of header pins manufactured with a pin-to-pin spacing of 2 mm. However, should other electrode placement methods be used that lead to inaccurate placement, the electrode positions would be inconsistent with those specified in the EIT forward problem and minor distortions of the final conductivity map could occur. Upon drying (after 6 h), the aforementioned silver electrodes are connected to a National Instruments (NI) DAQ. Minimization of experimental error is prevented by housing specimens in a customized wood platform to prevent undesirable detachments between electrodes and copper wires. FIG. 22A gives a schematic view of electrode placement while FIG. 22B shows a thin film specimen resting on the wood platform with 32 electrodes installed along its boundaries.

While many methods have been proposed to measure the actual boundary potential of a solid body, an adjacent electrode measurement technique is employed herein. By injecting a regulated alternating current using a current source (Keithley 6221) at a pair of adjacent electrodes, the NIDAQ with a rack-mounted multiplexed terminal block is employed to simultaneously measure the potential between the remaining pairs of electrodes. Upon determining the electrode boundary potentials, the current source and its corresponding current sink are shifted to the next adjacent electrode pair. The aforementioned process is cycled until all electrode pairs have been subjected to AC excitation. If the boundary has L electrodes, then the total number of independent boundary potential measurements made in the adjacent electrode technique is $L(L-1)/2$. Higher resolution (i.e. finer mesh) of conductivity mapping can be reached by increasing the number of electrodes, L, to obtain a larger set of independent boundary measurements.

5.5. Two-Dimensional pH Sensing

Based on a previous study conducted by Loh et al, electrochemical pH sensitivity can be encoded within thin films using SWNT and a poly(aniline) emeraldine base solution. Different levels of charge injection from pipetted pH buffer solutions (pH 1-10) lead to dramatic conductivity variations at areas where the pH buffer solutions come into direct contact with the (SWNT-PSS/PANI)n thin film surface. For pH studies, the fabricated (SWNT-PSS/PANI)n thin films (roughly 25×60 mm2 in area) are modified by mounting five plastic wells to its surface using high-vacuum grease (Dow Corning). Each plastic well serves as a chamber for containment of the pH buffer solutions while boundary potentials are measured for 2D EIT conductivity mapping of the specimen, thereby allowing simultaneous sensing of different pH solutions on a single thin film specimen. In this EIT experimental set-up, a total of 48 electrodes are applied.

6. Results and Discussion 6.1. EIT Validation of Conductivity Inhomogeneity

Figure 23:
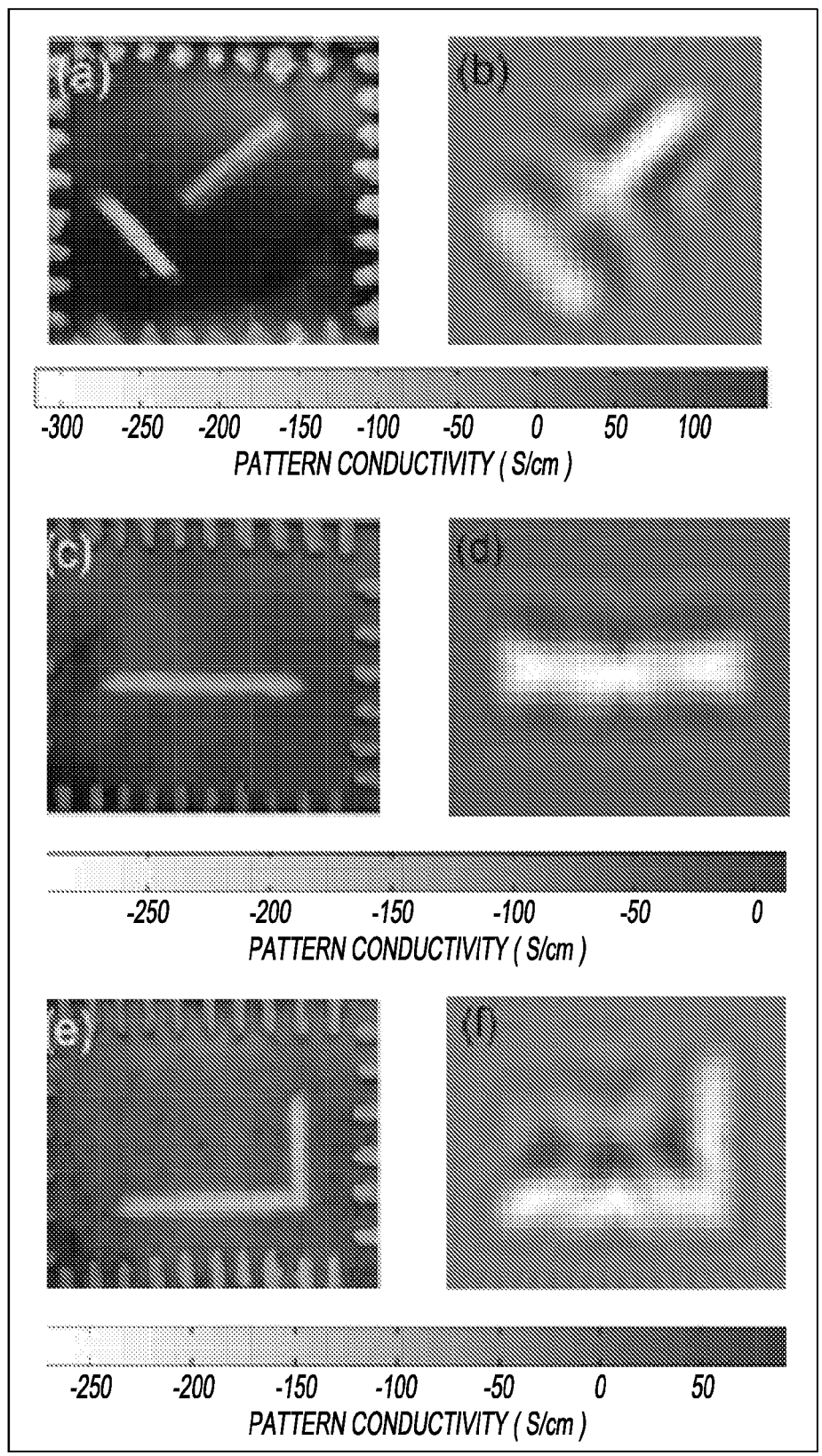

Validation of EIT conductivity mapping of LbL thin films is conducted by assessing conductivity homogeneity variations among four separate (SWNT-PSS/PVA)$_{50}$ thin film specimens. Following LbL fabrication, EIT is performed to obtain baseline conductivity maps ($\sigma_{base}$) for each thin film specimen. After the baseline conductivity maps are reconstructed, an intentional inhomogeneity is introduced within the film structure by physically etching straight, diagonal and L-shaped cuts into the film surface (FIGS. 23A, 23C, and 23E) to create regions of zero conductivity. After etching, EIT is performed again on each thin film specimen to obtain the etched conductivity maps ($\sigma_{etch}$). These maps are then subtracted from $\sigma_{base}$ to obtain associated pattern conductivity maps, $\sigma_{pattern}$. From FIGS. 23B, 23D, and 23F, it can be observed that EIT can clearly identify the change in conductivity within the thin film structure. When compared with the back-lighted photographs of the three aforementioned thin film specimens, the experimental EIT conductivity maps (FIGS. 23B, 23D, and 23F) correspond precisely with the photographs (FIGS. 23A, 23C, and 23E).

In order to demonstrate that the EIT technique can identify subtle changes in conductivity within the thin film structure, three levels of conductivity are encoded into a fourth specimen by controlling the number of bilayers deposited. From a previous study conducted by Loh et al, thin film conductivity increases in tandem with increasing number of bilayers deposited. Thus, fabrication of this fourth specimen with varied conductivity is accomplished by initially fabricating a (SWNT-PSS/PVA)$_{50}$ thin film. Upon mechanical etching of an 18×18 mm2 window in the middle of the film to form a region of zero conductivity, the LbL process continues to fabricate another (SWNT-PSS/PVA)25 thin film structure over the etched 50-bilayer film. Again, mechanical etching is employed to remove a 9×18 mm2 window before another 25-bilayer thin film is deposited (FIG. 24A); the final thin film structure consists of three different magnitudes of conductivity. Generally, darker regions of the backlighted image (FIG. 24B) suggest greater carbon nanotube deposition and hence increasing film conductivity. Using only a 32-electrode boundary set-up, EIT successfully identifies major and minor conductivity variations due to different CNT deposition densities (FIG. 24C)

6.2. EIT Validation of Measured Absolute Conductivity

As presented herein, the EIT method can reconstruct an absolute measure of thin film conductivity simply through boundary potential measurements. While it has been demonstrated that relative conductivity changes can be accurately identified via EIT (section 6.1), no experimental data suggest the calculated conductivity map corresponds to the true conductivity of the thin film. Here, a validation case study is presented to directly compare EIT conductivity estimates to experimental data obtained using traditional DC two-point probing.

Similar to section 6.1, the validation of absolute thin film spatial conductivity is conducted using 25×25 mm² (SWNT-PSS/PVA)$_{50}$ thin films fabricated on a silicon substrate (FIG. 25A). The pristine film is subjected to EIT to obtain its corresponding spatial conductivity map (where a total of 32 electrodes are used as described in section 5.4). Upon boundary potential measurements and EIT reconstruction, the thin film is physically sliced to form a 4×4 element grid with each element electrically isolated from all others (FIG. 25B). By drying colloidal silver paste between each grid element, individual element resistance (R) is measured via an Agilent 64401A digital multimeter connected in a two-point probe fashion. Once resistance is obtained for a grid element, the multimeter electrodes are removed and applied to the corresponding electrodes of the next element. This is repeated until all 16 mesh resistances have been determined. Since film resistivity, ρ (or equivalently conductivity, σ) is dependent on thin film thickness (h), the thickness of each thin film element is measured using ellipsometry (as detailed in section 5.3). Resistivity, p, is calculated by:

$$\rho = 1\sigma = Rlwh \qquad (7)$$

where w is the element's width and l is the distance between the two-point probe electrodes.

The EIT reconstructed conductivity map using 32 boundary electrodes is compared to the conductivity measured for each of the mesh elements by two-point probing. To make a direct comparison, the triangular elements of the EIT conductivity map that fall within the domain of each grid element are averaged. As presented in FIG. 25C, the average conductivity measured by EIT reconstruction is within 2.1% error of those measured by using two-point probe methods for each grid element. These results suggest the conductivity maps offered by EIT reconstruction are accurate as compared with more traditional conductivity measurement methods.

6.3. pH Sensing Skin (SWNT-PSS/PANI)n thin films have been shown to drastically increase in film resistance in tandem with increasing pH buffer solutions (pH 1-10). With a pH sensitivity of approximately 20.66 k_ cm-2/pH, these thin films serve as ideal candidates for pH sensing in a wide variety of applications (e.g. corrosion monitoring). The electrochemical response of (SWNT-PSS/PANI)n thin films have been characterized with entire films exposed to a single pH environment while two-point probe measurements are conducted. In contrast, EIT conductivity mapping offers a direct method of sensing pH variations across the entire thin film.

Demonstration of the potential functionality of (SWNTPSS/PANI)n thin films for distributed pH sensing is conducted using the experimental set-up described in section 5.5 (FIG. 26A). Prior to the application of pH buffer solutions in the five wells, the conductivity map of the thin film is reconstructed by EIT. This map will serve as a baseline map to which further conductivity maps will be compared. To illustrate the use of (SWNT-PSS/PANI)n thin films for biological applications, a small range of pH buffer solutions ranging from 5 to 9 are pipetted into the five wells. The EIT derived conductivity maps of the thin film exposed to pH buffer solutions are subtracted from the baseline conductivity, thereby revealing changes in conductivity due to pH. First, the surface of the thin film is exposed to pH buffer solutions corresponding to pH values of 7, 7.5, 8, 8.5 and 9; FIG. 26B reveals the conductivity of the (SWNT-PSS/PANI)$_{100}$ thin film decreases in linear proportion to pH. Second, the basic solutions are removed and acid buffer solutions with pH values 7, 6.5, 6, 5.5 and are applied to the film surface. FIG. 26C confirms the thin film undergoes an increase in the film conductivity in tandem with acidic pH. FIG. 27 summarizes the sensitivity of (SWNT-PSS/PANI)$_n$ thin film composites to pH stimuli including earlier work conducted by the same group. As shown, a linear relation exists in the pH sensitivity of electrochemically active (SWNT-PSS/PANI)$_n$ thin films.

6.4. Conclusions

According to the principles of the present teachings, electrical impedance tomography is employed to map the two-dimensional spatial conductivity distribution among layer-by-layer assembled carbon nanotube-polyelectrolyte composite thin films. First, validation of conductivity inhomogeneity is performed on four (SWNT-PSS/PVA)$_{100}$ thin film specimens. By mechanically etching different patterns within three of the films and fabricating three regions of different conductivity in the fourth, EIT spatial conductivity can accurately identify regions of inhomogeneous conductivity. Furthermore, to ensure that the mapped conductivity corresponds to the true conductivity of the thin film specimen, EIT results are compared with those measured using a DC two-point probe technique. When comparing EIT measured conductivity to measurements taken by two-point probe techniques, strong agreement (within 2%) is encountered.

With the accuracy of the EIT conductivity reconstruction established, the study focuses upon array sensing of pH using the surface of a single (SWNT-PSS/PANI)$_n$ thin film specimen. The conductivity maps of the film exposed to different pH buffer solutions in five locations reveal the outline of the solution wells. Furthermore, the change in conductivity of the film surface immediately below each circular well is shown to be linearly proportional to pH. The EIT method is clearly a powerful approach for measuring the conductivity of CNT thin film composites. The approach is elegant since repeated probe measurements need not be taken to measure thin film conductivity. As a result, multifunctional CNT composite films could be used in a variety of sensing applications where spatial depiction of conductivity changes to stimuli is desired (e.g. corrosion monitoring of metallic surfaces). While multilayered carbon nanotube-polyelectrolyte composite films are used as case studies in this work, it should be noted that the EIT approach to distributed sensing is rather general and can be applied to map the conductivity of other thin film materials. For example, the EIT technique can be easily applied to spatially image pH-induced conductivity changes of other polypyrrole and polyaniline composite films.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for sensing a stimulus, said method comprising:

providing a solid sensing skin having a first structure and a second structure, said first structure being made of a material different than said second structure, each of said first structure and said second structure being of nanoscale;

disposing said solid sensing skin upon a spatial area;

exposing said solid sensing skin to the stimulus thereby producing a physical change in said solid sensing skin;

employing electrical impedance tomography (EIT) to generate a spatial mapping of electrical properties of said solid sensing skin as a result of said physical change, said electrical impedance tomography being based on at least five electrodes coupled to said solid sensing skin with electrical current being applied to at least a pair of said electrodes and voltage measured on at least some of the remaining electrodes, said electrical properties including at least one of conductivity, impedance, and reactance; and analyzing said spatial mapping to determine at least one of location and severity of the stimulus.

2. The method according to claim 1 wherein said providing a solid sensing skin comprises fabricating said solid sensing skin via a layer-by-layer technique.

3. The method according to claim 1 wherein said providing a solid sensing skin comprises fabricating said solid sensing skin via a method chosen from the group consisting essentially of melt-pressing, thermosetting, extrusion, in situ polymerization, evaporation, thermal annealing, vacuum filtration, spin coating, mold casting, spray coating, painting, Langmuir-Blodgett, sol gel, and dip coating.

4. The method according to claim 1 wherein said providing a solid sensing skin having a first structure and a second structure comprises providing a solid sensing skin having a first structure and a second structure, wherein said first structure and said second structure are each chosen from the group consisting of nanotube, nanofiber, nanoparticle, nanowire, quantum dot, biological molecule, polymer, and combinations thereof.

5. A method for sensing a stimulus, said method comprising:

providing a structure;

providing a solid sensing skin by disposing a thin film on said structure, said thin film comprising a first structure and a second structure, said first structure being made of a material different than said second structure, each of said first structure and said second structure being of nanoscale;

at least five electrodes in electrical communication with said thin film and a source of current;

exposing said thin film to the stimulus; and calculating a spatial map of electrical properties of said thin film before, during and optionally after said thin film has been exposed to said stimulus using electrical impedance tomography to provide an image of the sensed stimulus, said electrical impedance tomography being based on said current being applied to at least a pair of said electrodes and voltage being measured on at least some of the remaining electrodes, said electrical properties including at least one of conductivity, impedance, and reactance.

6. The method according to claim 5 wherein said providing a solid sensing skin comprises fabricating said solid sensing skin via a layer-by-layer technique.

7. The method according to claim 5 wherein said providing a solid sensing skin comprises fabricating said solid sensing skin via a method chosen from the group consisting essentially of melt-pressing, thermosetting, extrusion, in situ polymerization, evaporation, thermal annealing, vacuum filtration, spin coating, mold casting, spray coating, painting, Langmuir-Blodgett, sol gel, and dip coating.

8. The method according to claim 5 wherein said providing a solid sensing skin having a first structure and a second structure comprises providing a solid sensing skin having a first structure and a second structure, wherein said first structure and said second structure are each chosen from the group consisting of nanotube, nanofiber, nanoparticle, nanowire, quantum dot, biological molecule, polymer, and combinations thereof.

9. A method for sensing a stimulus, said method comprising:

providing a structure;

providing a solid sensing skin by disposing a thin film on said structure, said thin film comprising a first structure and a second structure, said first structure being made of a material different than said second structure, each of said first structure and said second structure being of nanoscale;

at least five electrodes in electrical communication with said thin film and a source of current;

exposing said thin film to the stimulus; and calculating a spatial map of electrical properties of said thin film using electrical impedance tomography to provide an image of heterogeneity, said electrical impedance tomography being based on said current being applied to at least a pair of said electrodes and voltage being measured on at least some of the remaining electrodes, said electrical properties including at least one of conductivity, impedance, and reactance.

10. The method according to claim 9 wherein said providing a solid sensing skin comprises fabricating said solid sensing skin via a layer-by-layer technique.

11. The method according to claim 9 wherein said providing a solid sensing skin comprises fabricating said solid sensing skin via a method chosen from the group consisting essentially of melt-pressing, thermosetting, extrusion, in situ polymerization, evaporation, thermal annealing, vacuum filtration, spin coating, mold casting, spray coating, painting, Langmuir-Blodgett, sol gel, and dip coating.

12. The method according to claim 9 wherein said providing a solid sensing skin having a first structure and a second structure comprises providing a solid sensing skin having a first structure and a second structure, wherein said first structure and said second structure are each chosen from the group consisting of nanotube, nanofiber, nanoparticle, nanowire, quantum dot, biological molecule, polymer, and combinations thereof.

13. A method for sensing a stimulus, said method comprising:

providing a structure;

providing a solid sensing skin by disposing a thin film on said structure, said thin film comprising a first structure and a second structure, said first structure being made of a material different than said second structure, each of said first structure and said second structure being of nanoscale;

at least five electrodes in electrical communication with said thin film and a source of current;

exposing said thin film to the stimulus; and calculating a spatial map of electrical properties said thin film using electrical impedance tomography to provide an image of physical discontinuity, said electrical impedance tomography being based on said current being applied to at least a pair of said electrodes and voltage being measured on at least some of the remaining electrodes, said electrical properties including at least one of conductivity, impedance, and reactance.

14. The method according to claim 13 wherein said providing a solid sensing skin comprises fabricating said solid sensing skin via a layer-by-layer technique.

15. The method according to claim 13 wherein said providing a solid sensing skin comprises fabricating said solid sensing skin via a method chosen from the group consisting essentially of melt-pressing, thermosetting, extrusion, in situ polymerization, evaporation, thermal annealing, vacuum filtration, spin coating, mold casting, spray coating, painting, Langmuir-Blodgett, sol gel, and dip coating.

16. The method according to claim 13 wherein said providing a solid sensing skin having a first structure and a second structure comprises providing a solid sensing skin having a first structure and a second structure, wherein said first structure and said second structure are each chosen from the group consisting of nanotube, nanofiber, nanoparticle, nanowire, quantum dot, biological molecule, polymer, and combinations thereof.

17. The method according to claim 13, further comprising:
    determining a structural integrity of said structure in response to said spatial map.

18. The method according to claim 13, further comprising:
    determining a structural abnormality in said structure in response to said spatial map.

19. The method according to claim 18 wherein said determining a structural abnormality in said structure comprises detecting at least one of the group consisting of cuts, tears, failures, corrosion, and pH changes in said structure.

* * * * *

UNITED STATES PATENT AND TRADEMARK OFFICE
CERTIFICATE OF CORRECTION

PATENT NO. : 8,159,235 B2
APPLICATION NO. : 12/209318
DATED : April 17, 2012
INVENTOR(S) : Jerome P. Lynch et al.

Page 1 of 1

It is certified that error appears in the above-identified patent and that said Letters Patent is hereby corrected as shown below:

On the Title Page, Item [75], Inventors, 2$^{nd}$ Inventor's Name, "Tsung-Chin Huo" should be --Tsung-Chin Hou--.

On the Title Page, Item [56], References Cited, Other Publication Reference line 3, "under 8" should be --Number 8--.

In the Specifications:

Column 7, line 24, "illustrating" should be --illustrations--.

Column 8, line 53, "$\gamma = \sigma$" should be --$\gamma \approx \sigma$--.

Column 12, line 21, "18 M" should be --18 $M_-$--.

Column 12, line 60, "thinfilm" should be --thin film--.

Column 23, line 4, "(table 1)" should be --(Table I)--.

Column 24, line 53, "(SWNT-PSS/PVA)25" should be --(SWNT-PSS/PVA)$_{25}$--.

Column 24, line 63, after "(FIG. 24C)" insert --.--.

In the Claims:

Column 25, line 27, claim 26, "p" should be --$\rho$--.

Column 26, line 6, after "and" insert --5--.

Signed and Sealed this
Eighteenth Day of June, 2013

Teresa Stanek Rea
*Acting Director of the United States Patent and Trademark Office*